US012588515B2

(12) United States Patent
Kothari et al.

(10) Patent No.: US 12,588,515 B2
(45) Date of Patent: Mar. 24, 2026

(54) ELECTRONIC DEVICES COMPRISING OVERLAY MARKS

(71) Applicant: Micron Technology, Inc., Boise, ID (US)

(72) Inventors: Rohit Kothari, Boise, ID (US); Harsh Narendrakumar Jain, Boise, ID (US); John D. Hopkins, Meridian, ID (US); Xiaosong Zhang, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 18/168,483

(22) Filed: Feb. 13, 2023

(65) Prior Publication Data

US 2023/0197627 A1     Jun. 22, 2023

Related U.S. Application Data

(63) Continuation of application No. 16/546,759, filed on Aug. 21, 2019, now Pat. No. 11,581,264.

(51) Int. Cl.
H01L 23/544 (2006.01)
G03F 9/00 (2006.01)

(52) U.S. Cl.
CPC .......... H01L 23/544 (2013.01); G03F 9/7073 (2013.01); G03F 9/7076 (2013.01); G03F 9/708 (2013.01); G03F 9/7084 (2013.01); H01L 2223/54426 (2013.01); H01L 2223/5446 (2013.01)

(58) Field of Classification Search
None
See application file for complete search history.

(56) References Cited

U.S. PATENT DOCUMENTS

| | | | |
|---|---|---|---|
| 5,792,687 A * | 8/1998 | Jeng | H10B 12/033 |
| | | | 257/E21.648 |
| 6,297,124 B1 | 10/2001 | New et al. | |
| 7,068,833 B1 | 6/2006 | Ghinovker et al. | |

(Continued)

FOREIGN PATENT DOCUMENTS

| | | |
|---|---|---|
| JP | 2014-228708 A | 12/2014 |
| TW | 201911537 A | 3/2019 |

OTHER PUBLICATIONS

ICKnowledge, www.icknowledge.com (2012).

(Continued)

*Primary Examiner* — Feifei Yeung Lopez
(74) *Attorney, Agent, or Firm* — TraskBritt

(57) ABSTRACT

An electronic device comprising a multideck structure including a base stack of materials and one or more stacks of materials on the base stack of materials, at least one high aspect ratio feature in an array region in the base stack of materials and in the one or more stacks of materials, and overlay marks including an optical contrast material in or on only an upper portion of the base stack of materials in an overlay mark region of the electronic device is disclosed. The overlay mark region is laterally adjacent to the array region and the overlay marks are adjacent to at least one additional high aspect ratio feature in the base stack of materials. Additional electronic devices and memory devices are disclosed.

14 Claims, 12 Drawing Sheets

(56) References Cited

U.S. PATENT DOCUMENTS

| | | | | |
|---|---|---|---|---|
| 7,192,839 | B1* | 3/2007 | Ramkumar | H01L 23/544 |
| | | | | 257/E23.179 |
| 9,490,116 | B2 | 11/2016 | Tsiang et al. | |
| 2003/0071369 | A1 | 4/2003 | Huang et al. | |
| 2008/0179744 | A1 | 7/2008 | Yu | |
| 2009/0206411 | A1 | 8/2009 | Koketsu et al. | |
| 2010/0309470 | A1 | 12/2010 | Liu et al. | |
| 2011/0027704 | A1 | 2/2011 | Cramer et al. | |
| 2011/0033786 | A1 | 2/2011 | Sandhu | |
| 2013/0277731 | A1 | 10/2013 | Goda et al. | |
| 2014/0120722 | A1* | 5/2014 | Richardson | H01L 21/76879 |
| | | | | 438/675 |
| 2014/0167297 | A1 | 6/2014 | Tsai | |
| 2014/0273373 | A1 | 9/2014 | Makala et al. | |
| 2014/0349439 | A1 | 11/2014 | Kondo et al. | |
| 2016/0153914 | A1* | 6/2016 | Lange | G01N 21/9505 |
| | | | | 356/237.5 |
| 2016/0204117 | A1* | 7/2016 | Liu | H10B 41/35 |
| | | | | 257/324 |
| 2017/0148748 | A1 | 5/2017 | Jeong et al. | |
| 2017/0167862 | A1 | 6/2017 | Dziura et al. | |
| 2017/0358539 | A1* | 12/2017 | Tsunemine | H01L 21/0273 |
| 2017/0371227 | A1* | 12/2017 | Skirlo | G02F 1/2955 |
| 2018/0006049 | A1* | 1/2018 | Inomata | H01L 23/5283 |
| 2018/0033735 | A1 | 2/2018 | Ozawa | |
| 2018/0238814 | A1 | 8/2018 | Sapiens et al. | |
| 2018/0277494 | A1* | 9/2018 | Kusakabe | H10B 43/10 |
| 2019/0198333 | A1 | 6/2019 | Tokashiki | |
| 2019/0237476 | A1* | 8/2019 | Lee | H10B 43/27 |
| 2020/0091182 | A1* | 3/2020 | Shishido | H01L 23/544 |

OTHER PUBLICATIONS

International Search Report for Application No. PCT/US2020/070389, mailed Nov. 17, 2020, 3 pages.
Taiwanese First Office Action for Application No. 109127311, issued Jul. 6, 2021, 19 pages.
Taiwanese Search Report and Office Action from Taiwanese Application No. 109127311, dated Mar. 22, 2022, 15 pages with English translation.
Written Opinion of the International Searching Authority for Application No. PCT/US2020/070389, mailed Nov. 17, 2020, 7 pages.
Korean Notice of Reasons for Rejection for Korean Application No. 10-2022-7008603, dated Apr. 17, 2024, 21 pages with English translation.
Mack, Chris A., Glossary of Lithography Terms—O, URL: https://www.lithoguru.com/scientist/glossary/O.html, retrieved Aug. 1, 2024, 3 pages.
Korean Second Notice of Reasons for Rejection for Korean Application No. 10-2022-7008603, dated Feb. 24, 2025, 6 pages with English translation.

* cited by examiner

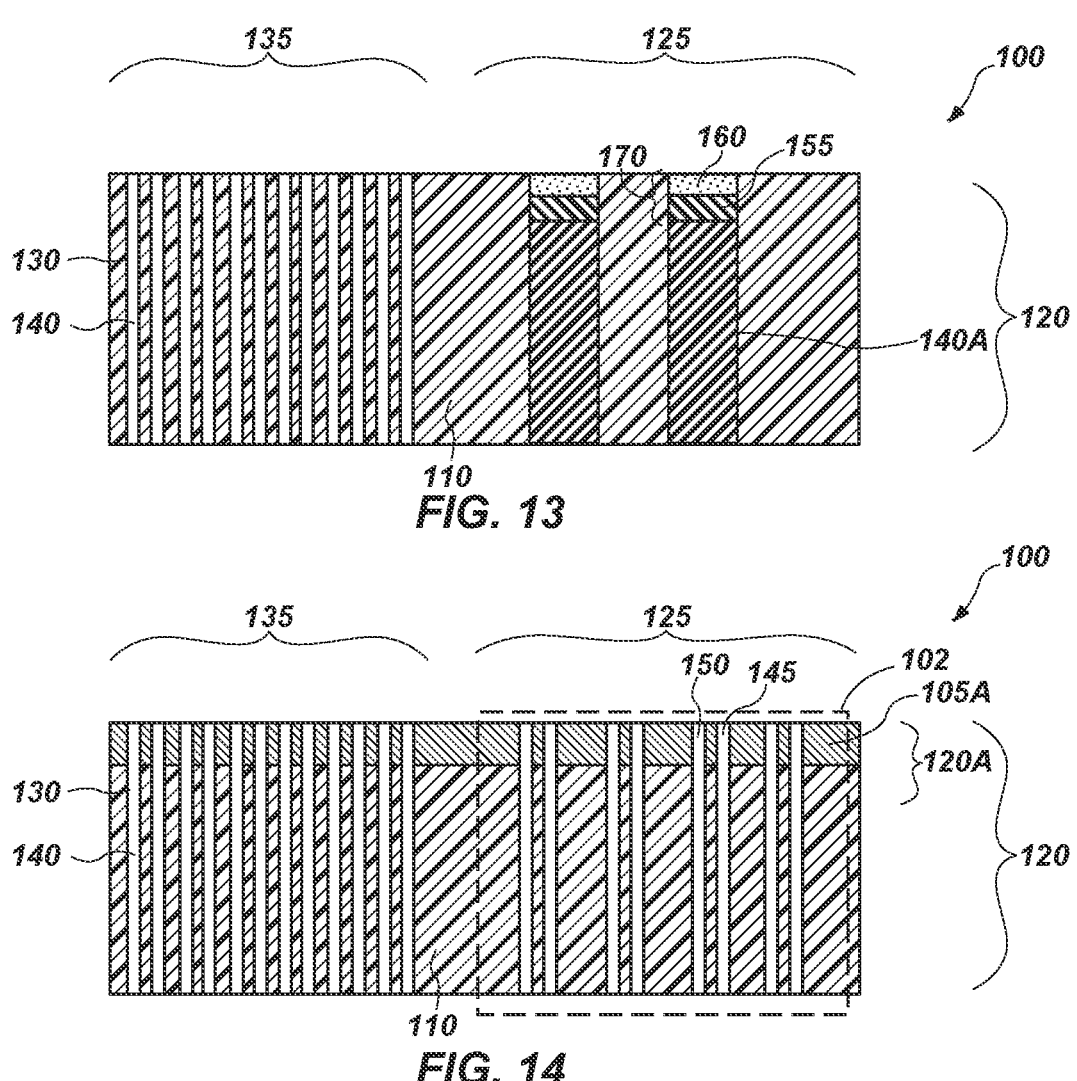
FIG. 13
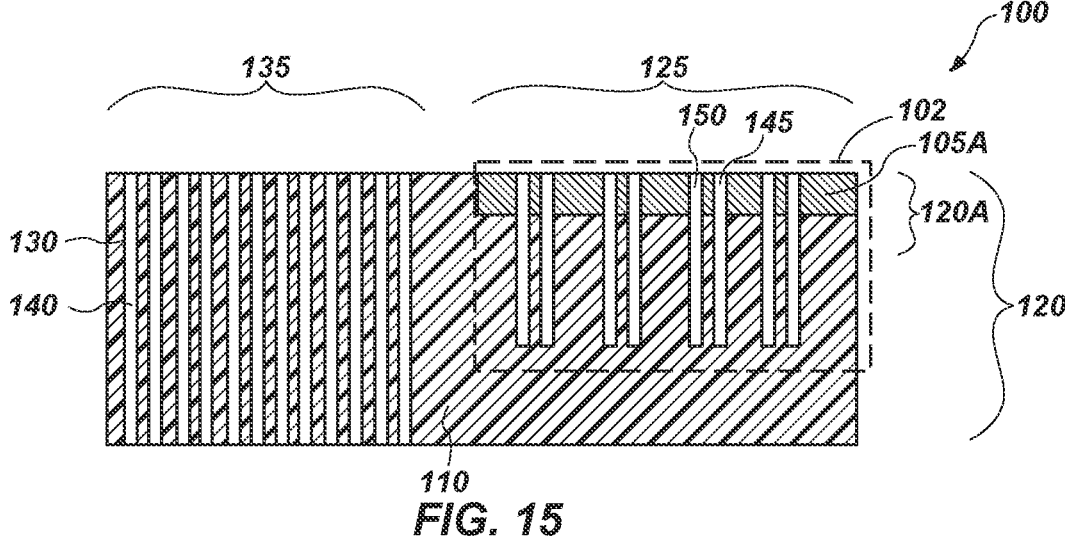
FIG. 14
FIG. 15

ELECTRONIC DEVICES COMPRISING OVERLAY MARKS

CROSS-REFERENCE TO RELATED APPLICATION

This application is a continuation of U.S. patent application Ser. No. 16/546,759, filed Aug. 21, 2019, now U.S. Pat. No. 11,581,264, issued Feb. 14, 2023, the disclosure of which is hereby incorporated herein in its entirety by this reference.

TECHNICAL FIELD

Embodiments disclosed herein relate to electronic devices and electronic device fabrication. More particularly, embodiments of the disclosure relate to overlay marks on electronic devices comprising high aspect ratio features, overlay marks on memory devices comprising high aspect ratio features, and to related methods of forming the high aspect ratio features in the electronic devices.

BACKGROUND

Electronic device (e.g., semiconductor device, memory device) designers often desire to increase the level of integration or density of features (e.g., components) within an electronic device by reducing the dimensions of the individual features and by reducing the separation distance between neighboring features. Electronic device designers also desire to design architectures that are not only compact, but offer performance advantages, as well as simplified designs. Reducing the dimensions and spacing of features has placed increasing demands on the methods used to form the electronic devices. One solution has been to form three-dimensional (3D) electronic devices, in which the features are arranged vertically rather than horizontally. To form the features, high aspect ratio (HAR) openings are formed in a stack of materials, with one or more materials subsequently formed in the HAR openings to produce HAR features.

Overlay marks, also known as alignment marks or registration marks, are positioned on the stack of materials and used to form one or more stacks (e.g., decks) of materials over an initial (e.g., a base) stack of materials. The stacks of conventional 3D electronic devices may be transparent to the wavelength(s) of radiation used in conventional alignment and overlay processes. An alignment measurement system (e.g., a metrology system) measures the position of the overlay marks by irradiating the overlay marks with a measurement radiation beam, receiving at least a portion of the measurement radiation beam scattered from the overlay marks, and determining a position of the overlay marks from the scattered radiation. Scribe-overlay mark features are created simultaneously with the active memory array and often result in poor optical contrast between the transparent materials of the stacks and the materials of the overlay marks. This leads to large overlay errors and high yield loss occurring with the conventional 3D electronic devices. The overlay alignment marks on the initial deck are used to overlay subsequent decks with tight overlay specifications. The overlay marks are detected by the metrology system, which is used by a lithography system to align the subsequently-formed decks over the initial deck. As aspect ratios of the HAR features in the 3D electronic devices increase, overlay errors between the decks have increased and give uncorrectable errors. Additionally, as the number of decks in the 3D electronic devices increase, the HAR features exhibit imperfections, such as tilting, twisting, and critical dimension (CD) changes, along a length of the HAR features. The overlay alignment marks exhibit a similar pattern to the HAR features and include similar imperfections along a length thereof. When the radiation (e.g., a detection signal from the metrology system) is reflected by the overlay alignment marks, the imperfections in the overlay alignment marks cause an alignment signal arising from a bulk volume (e.g., lower portion and middle portion) of the stack to differ from the alignment signal arising from an upper portion of the stack. Since the stacks are transparent, a significant portion of the radiation reflected by the overlay marks and detected by the metrology system is contributed by the bulk volume of the stack, which includes a relatively large percentage of the imperfections. The differences in alignment signal lead to false and compromised detection of the overlay alignment marks due to incorrect information being received from the other portions of the stack. The differences in alignment signal between the upper portion of the stack and the other portions of the stack lead to false and compromised detection of the overlay alignment marks. As the number of stacks in multideck structures of the 3D electronic devices increases, large overlay errors and high yield loss will continue to increase. For patterning layers of thick memory stacks, thick sacrificial hardmasks are used, which could be opaque to wavelength(s) of radiation used in conventional alignment and overlay processes and, therefore, additional semiconductor processing is required to enable overlay-topography transfer.

BRIEF DESCRIPTION OF THE DRAWINGS

FIGS. 1-11 and 14-17 are cross-sectional views of electronic devices including overlay marks according to embodiments of the disclosure in an upper portion of an overlay mark region and HAR features in an array region;

FIGS. 12 and 13 are cross-sectional views of electronic devices including overlay marks according to embodiments of the disclosure having metallized surfaces;

DETAILED DESCRIPTION

Figures 1, 2, 3:
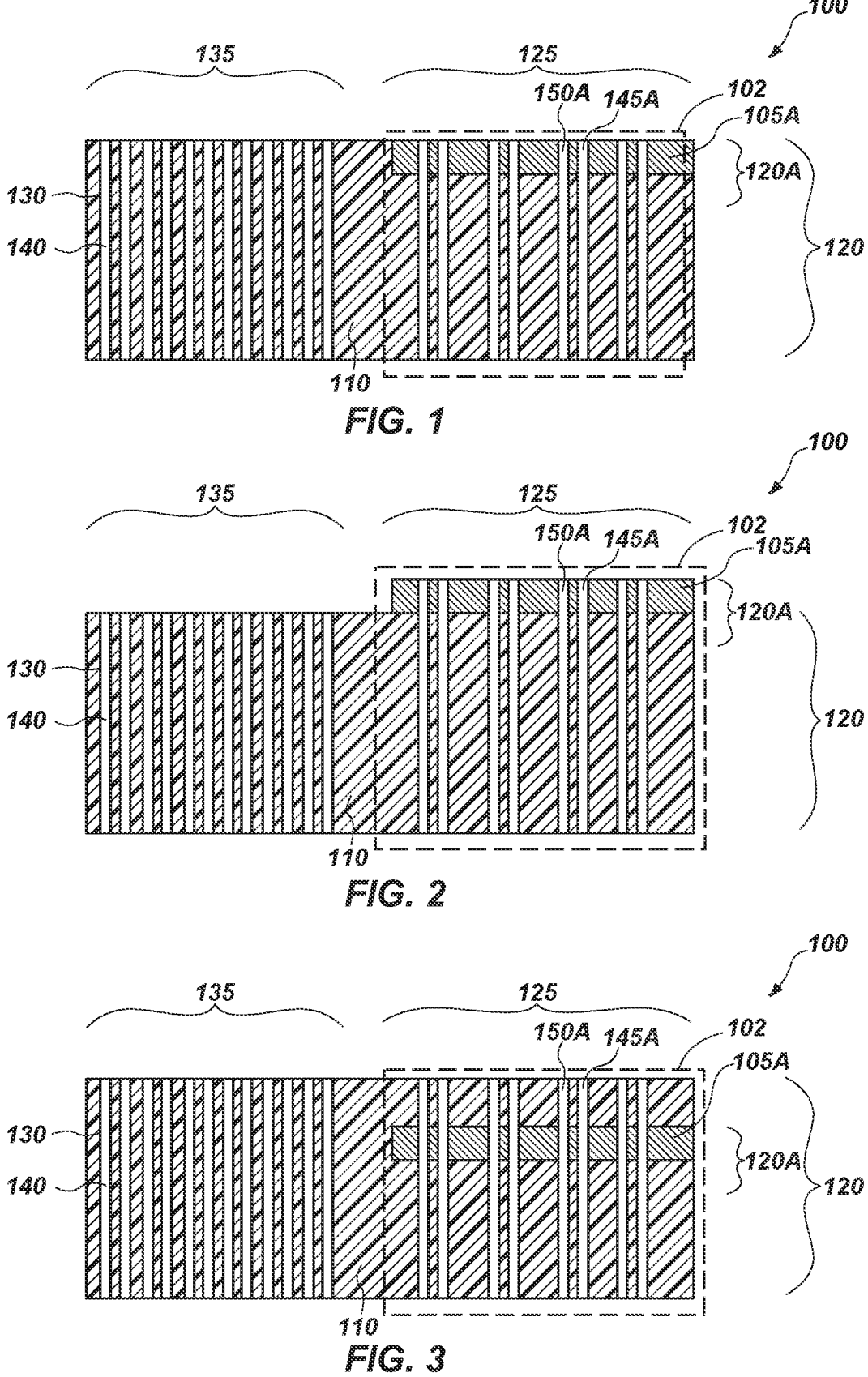

An electronic device (e.g., an apparatus, a semiconductor device, a memory device) that includes one or more overlay marks in an upper portion of a stack (e.g., a deck) of materials is disclosed. The one or more overlay marks may include an optical contrast material (e.g., a reflective material, an opaque material). Depending on the material used in the overlay marks, the overlay marks may reflect radiation transmitted from a metrology system to a photolithography system for detection or may substantially prevent (e.g., substantially block) the reflection of the radiation from other portions (e.g., a middle portion, a lower portion) of the stack. Therefore, the overlay marks according to embodiments of the disclosure provide improved optical signal from the upper portion of the stack while optical signal from the other portions of the stack is substantially reduced or eliminated. The electronic device includes a three-dimensional (3D) electronic device having multiple decks (i.e., a multideck structure), where one or more decks are formed over an initial deck (e.g., a first deck, an initial stack, a base stack) including the overlay marks. The stacks of materials may be transparent to the wavelength(s) of radiation used in alignment and overlay processes that are subsequently conducted. The decks of the 3D electronic device include high aspect ratio (HAR) openings, in which HAR features are ultimately to be formed in an array region of the electronic device. The overlay marks are formed in an overlay mark region of the electronic device. By positioning the one or more overlay marks in the upper portion of the initial deck, the overlay marks provide stable and accurate overlay of the subsequently-formed decks adjacent to (e.g., over) the initial deck. The optical signals from the other portions of the initial deck may be substantially or at least partially blocked. The overlay marks, therefore, substantially prevent or substantially reduce overlay errors during formation of the HAR openings, enabling the HAR features to be formed at tight tolerances.

By positioning the overlay marks in the upper portion of the stack, the overlay marks provide increased optical contrast compared to the optical contrast provided by conventional electronic devices having transparent stacks of materials and conventional overlay marks. The overlay marks according to embodiments of the disclosure provide increased optical response of alignment and registration signals during subsequently-conducted photolithography acts and enable better overlay performance during the fabrication of the 3D electronic device. In some embodiments, the overlay marks function as low aspect ratio features in the upper portion of the stack and provide better optical contrast with materials surrounding the overlay marks during subsequently-conducted process acts. In other embodiments, the overlay marks function as raised topography or lowered topography in the upper portion of the stack. The topography of the stack is translated into decks subsequently formed on the stack. The overlay marks according to embodiments of the disclosure may achieve tight tolerances when the subsequently-formed decks and the high aspect ratio features are formed. The tolerances to be achieved with current 3D electronic devices are about 50 nm or below, such as from about 1 nm to about 50 nm, from about 1 nm to about 20 nm, from about 1 nm to about 5 nm, from about 1 nm to about 10 nm, from about 5 nm to about 15 nm, from about 5 nm to about 10 nm, or from about 10 nm to about 15 nm.

The following description provides specific details, such as material types, material thicknesses, and process conditions in order to provide a thorough description of embodiments described herein. However, a person of ordinary skill in the art will understand that the embodiments disclosed herein may be practiced without employing these specific details. Indeed, the embodiments may be practiced in conjunction with conventional fabrication techniques employed in the semiconductor industry. In addition, the description provided herein does not form a complete description of an electronic device or a complete process flow for manufacturing the electronic device and the structures described below do not form a complete electronic device. Only those process acts and structures necessary to understand the embodiments described herein are described in detail below. Additional acts to form a complete electronic device may be performed by conventional techniques.

The materials described herein may be formed by conventional techniques including, but not limited to, spin coating, blanket coating, chemical vapor deposition ("CVD"), atomic layer deposition ("ALD"), plasma enhanced ALD, physical vapor deposition ("PVD") (including sputtering, evaporation, ionized PVD, and/or plasma-enhanced CVD), or epitaxial growth. Alternatively, the materials may be grown in situ. Depending on the specific material to be formed, the technique for depositing or growing the material may be selected by a person of ordinary skill in the art. The removal of materials may be accomplished by any suitable technique including, but not limited to, etching (e.g., dry etching, wet etching, vapor etching), ion milling, abrasive planarization (e.g., chemical-mechanical planarization), or other known methods unless the context indicates otherwise.

Drawings presented herein are for illustrative purposes only and are not meant to be actual views of any particular material, component, structure, device, or electronic system. Variations from the shapes depicted in the drawings as a result, for example, of manufacturing techniques and/or tolerances, are to be expected. Thus, embodiments described herein are not to be construed as being limited to the particular shapes or regions as illustrated, but include deviations in shapes that result, for example, from manufacturing. For example, a region illustrated or described as box-shaped may have rough and/or nonlinear features, and a region illustrated or described as round may include some rough and/or linear features. Moreover, sharp angles that are illustrated may be rounded, and vice versa. Thus, the regions illustrated in the figures are schematic in nature, and their shapes are not intended to illustrate the precise shape of a region and do not limit the scope of the present claims. The drawings are not necessarily to scale. Additionally, elements common between figures may retain the same numerical designation.

As used herein, the singular forms "a," "an," and "the" are intended to include the plural forms as well, unless the context clearly indicates otherwise.

As used herein, "and/or" includes any and all combinations of one or more of the associated listed items.

As used herein, "about" or "approximately" in reference to a numerical value for a particular parameter is inclusive of the numerical value and a degree of variance from the numerical value that one of ordinary skill in the art would understand is within acceptable tolerances for the particular parameter. For example, "about" or "approximately" in reference to a numerical value may include additional numerical values within a range of from 90.0 percent to 110.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

As used herein, spatially relative terms, such as "beneath," "below," "lower," "bottom," "above," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (e.g., rotated 90 degrees, inverted, flipped) and the spatially relative descriptors used herein interpreted accordingly.

As used herein, the term "configured" refers to a size, shape, material composition, and arrangement of one or more of at least one structure and at least one apparatus facilitating operation of one or more of the structure and the apparatus in a pre-determined way.

As used herein, the terms "high," "higher," "medium," "low," and "lower" are relative terms and do not denote a specific dimension or range of dimensions unless otherwise noted.

As used herein, reference to an element as being "on" or "over" another element means and includes the element being directly on top of, adjacent to (e.g., laterally adjacent to, vertically adjacent to), underneath, or in direct contact with the other element. It also includes the element being indirectly on top of, adjacent to (e.g., laterally adjacent to, vertically adjacent to), underneath, or near the other element, with other elements present therebetween. In contrast, when an element is referred to as being "directly on" or "directly adjacent to" another element, no intervening elements are present.

As used herein, the term "overlay mark" means and includes a structure that provides optical contrast properties compared to a surrounding material. The overlay mark includes multiple materials that provide the optical contrast properties. The overlay mark includes a feature material and an opaque material or the feature material and a reflective material. The overlay mark may include at least one of an alignment mark or a registration mark.

As used herein, the term "sacrificial material" means and includes a material that is formed during a fabrication process but that is subsequently removed, prior to completion of the fabrication process.

As used herein, the term "selectively etchable" means and includes a material that exhibits a greater etch rate responsive to exposure to a given etch chemistry and/or process conditions relative to another material exposed to the same etch chemistry and/or process conditions. For example, the material may exhibit an etch rate that is at least about five times greater than the etch rate of another material, such as an etch rate of about ten times greater, about twenty times greater, or about forty times greater than the etch rate of the another material. Etch chemistries and etch conditions for selectively etching a desired material may be selected by a person of ordinary skill in the art.

As used herein, the term "electronic device" includes without limitation a memory device, as well as semiconductor devices which may or may not incorporate memory, such as a logic device, a processor device, or a radiofrequency (RF) device. Further, an electronic device may incorporate memory in addition to other functions such as, for example, a so-called "system on a chip" (SoC) including a processor and memory, or an electronic device including logic and memory. The electronic device may be a 3D electronic device including, but not limited to, a 3D NAND Flash memory device, such as a 3D floating gate NAND Flash memory device, a 3D replacement gate NAND Flash memory device, a 3D DRAM electronic device, or 3D logic.

As used herein, the term "stack" means and includes a structure having multiple materials, such as alternating first and second materials, with the second material formed over the first material. The stack may include alternating conductive materials and insulating materials, such as alternating polysilicon materials and oxide materials, or alternating nitride materials and insulating materials, such as alternating nitride materials and oxide materials.

As used herein, the term "substantially" in reference to a given parameter, property, or condition means and includes to a degree that one of ordinary skill in the art would understand that the given parameter, property, or condition is met with a degree of variance, such as within acceptable manufacturing tolerances. By way of example, depending on the particular parameter, property, or condition that is substantially met, the parameter, property, or condition may be at least 90.0% met, at least 95.0% met, at least 99.0% met, or even at least 99.9% met.

As used herein, the term "substrate" means and includes a material (e.g., a base material) or construction upon which additional materials are formed. The substrate may be a an electronic substrate, a semiconductor substrate, a base semiconductor layer on a supporting structure, a metal electrode, an electronic substrate having one or more materials, layers, structures, or regions formed thereon, or a semiconductor substrate having one or more materials, layers, structures, or regions formed thereon. The materials on the electronic substrate or semiconductor substrate may include, but are not limited to, semiconductive materials, insulating materials, conductive materials, etc. The substrate may be a conventional silicon substrate or other bulk substrate comprising a layer of semiconductive material. As used herein, the term "bulk substrate" means and includes not only silicon wafers, but also silicon-on-insulator ("SOI") substrates, such as silicon-on-sapphire ("SOS") substrates and silicon-on-glass ("SOG") substrates, epitaxial layers of silicon on a base semiconductor foundation, and other semiconductor or optoelectronic materials, such as silicon-germanium, germanium, gallium arsenide, gallium nitride, and indium phosphide. The substrate may be doped or undoped.

As used herein, the term "tier" refers collectively to a unit of a first material and second material of the stack, with the second material directly overlying or directly underlying the first material. By way of example only, the tier may include a conductive material and a directly overlying or directly underlying insulating material, or a conductive material and a directly overlying or directly underlying nitride material.

As used herein, the terms "vertical," "longitudinal," "horizontal," and "lateral" are in reference to a major plane of a structure and are not necessarily defined by Earth's gravitational field. A "horizontal" or "lateral" direction is a direction that is substantially parallel to the major plane of the structure, while a "vertical" or "longitudinal" direction is a direction that is substantially perpendicular to the major plane of the structure. The major plane of the structure is defined by a surface of the structure having a relatively large area compared to other surfaces of the structure.

If the overlay marks include the reflective material (e.g., an optically reflective material) as the optical contrast material and the feature material, the overlay marks may be formulated and configured to increase an amount of reflected (e.g., refracted) radiation of a desired wavelength contributed by the upper portion of the stack, which is reflected back to the photolithography system for detection. The increased contribution of the reflected radiation from the upper portion of the stack is relative to the radiation contributed by conventional overlay marks. The reflective material reflects the radiation that is transmitted through the upper portion of the stack for detection by the photolithography system.

If the overlay marks include the opaque material (e.g., an optically opaque material) and the feature material, the overlay marks may be formulated and configured to decrease an amount of radiation of a desired wavelength contributed (e.g., reflected, diffracted) by the middle and lower portions of the stack and received by the photolithography system for detection. The opaque material may substantially reduce (e.g., substantially prevent) the radiation contributed by the middle and lower portions of the stack from passing through the opaque material of the overlay marks. Therefore, the radiation contributed by the middle and lower portions of the stack may not be detected by the photolithography system and only that radiation contributed by the upper portion of the stack may be detected by the photolithography system. The radiation transmitted by the metrology tool and detected by the photolithography system may be within vacuum ultraviolet, ultraviolet, visible, and/or infrared wavelength ranges.

Electronic devices 100 including embodiments of overlay marks 102 are shown in FIGS. 1-17. The electronic devices 100 include the one or more overlay marks 102 in or on tiers (not shown) of materials (not shown) of a stack 120. The overlay marks 102 (shown by the dashed box) include optical contrast material 105 and feature material 110 in overlay mark region 125 of the stack 120. The optical contrast material 105 may be an opaque material 105A (FIGS. 1-9, 14, and 15) or a reflective material 105B (FIGS. 10-13). The materials of the stack 120 may be selectively etchable relative to one another and may also be selectively etchable relative to the optical contrast material 105 of the overlay marks 102. For simplicity, individual materials of the stack 120 are not shown in all of the drawings. It is understood, however, that the stack 120 includes the tiers 190 of alternating materials 115A, 115B, as illustrated in FIGS. 16-20. By way of example only, the materials of a single tier may include a nitride material and a dielectric material or a conductive material and a dielectric material. The stack 120 includes multiple tiers of alternating nitride materials and dielectric materials or alternating conductive materials and dielectric materials. For convenience, the tiers are described herein as including alternating nitride materials and dielectric materials. However, the tiers may alternatively include alternating conductive materials and dielectric materials. Suitable dielectric materials, nitride materials, and conductive materials of the tiers of the stack 120 may be selected by a person of ordinary skill in the art.

The electronic device 100 includes the one or more overlay marks 102 in only an upper portion 120A of the tiers or on an uppermost tier of the stack 120. The upper portion 120A of the tiers is not limited to a specific number of alternating materials and may include any number of alternating materials. By way of example only, the upper portion 120A includes at least one of each of the alternating materials (i.e., a tier of the alternating materials). The upper portion 120A of the tiers is also not limited to a specific number of tiers. By way of example only, the upper portion 120A may include one or more tiers.

By including the optical contrast material 105 of the overlay marks 102 in or on the upper portion 120A of the tiers, the optical contrast material 105 may effectively function as a low aspect ratio feature of the overlay marks 102 that reflects radiation (if the reflective material is used) from the upper portion 120A or that substantially blocks the reflection of radiation (if the opaque material is used) from the middle and lower portions during subsequently-conducted photolithography acts. Therefore, optical signal generated from the middle portion and/or the lower portion of the tiers may not contribute to the optical signal detected by the photolithography system and used for alignment and overlay of subsequently-formed decks. Since the optical contrast material 105 of the overlay marks 102 functions as the low aspect ratio features, the overlay marks 102 includes fewer imperfections along a length thereof. In comparison, conventional overlay marks include features in a corresponding overlay mark region that are substantially similar to the HAR features of an array region of the corresponding device. The conventional overlay marks include significantly more imperfections along a length thereof since their length is longer. The optical signal produced from the overlay marks 102 in the upper portion 120A is, therefore, more accurate than that produced from conventional overlay alignment marks, which includes optical signal contributions from the upper, middle, and lower portions of a corresponding stack. The overlay marks 102 in the overlay mark region 125 include the opaque material 105A or the reflective material 105B in addition to the feature material 110. A thickness at which the opaque material 105A or the reflective material 105B is formed may depend on desired properties of the overlay marks 102.

The overlay marks 102 may be present in the overlay mark region 125 of the stack 120, with one or more HAR features 140 in HAR openings 130 present in array region 135 of the stack 120. The overlay marks 102 in the overlay mark region 125 may include HAR features 150A (FIGS. 1-3), medium aspect ratio features 150B (FIGS. 4-6), or low aspect ratio features 150C (FIGS. 7A-9). The HAR features 140 may be formed in the HAR openings 130 in the array region 135 during a subsequent process act, such as by depositing the feature material 110 in the HAR openings 130. The feature material 110 may be formed in HAR openings 145A, medium aspect ratio openings 145B, or low aspect ratio openings 145C in the overlay mark region 125 at substantially the same time as the HAR features 140 are formed in the HAR openings 130 in the array region 135. In FIGS. 1-9, the feature material 110 of the HAR features 140 is shown in the HAR openings 130 for convenience. The HAR features 140 may be formed by, for example, depositing the feature material 110 in the HAR openings 130. Alternatively, a sacrificial material (not shown) may initially be formed in the HAR openings 130 and subsequently replaced with the feature material 110 during a subsequent process act. Alternatively, the sacrificial material may remain in the electronic device 100. The feature material 110 or sacrificial material may be substantially transparent to the wavelength of radiation produced by the metrology system and detected by the photolithography system. If a sacrificial material is used and does not remain in the electronic device 100, the sacrificial material may be subsequently removed by conventional techniques and the feature material 110 formed in its place.

The electronic device 100 including multiple decks (see FIGS. 16 and 17) may exhibit an overall aspect ratio of greater than or equal to about 50:1, such as greater than or equal to about 60:1, greater than or equal to about 70:1, greater than or equal to about 80:1, greater than or equal to about 90:1, or greater than or equal to about 100:1. For example, the overall aspect ratio of the electronic device 100 may be between about 50:1 and about 200:1, between about 50:1 and about 150:1, between about 75:1 and about 125:1, or between about 100:1 and about 150:1. Each deck (e.g., stack) may be formed at a thickness of from about 5 μm to about 15 μm, such as from about 5 μm to about 10 μm or from about 10 μm to about 15 μm. By forming a desired number of decks, the overall aspect ratio of the electronic device 100 is achieved. The overlay mark region 125 on which or in which the overlay marks 102 are formed may be in a scribe region of the electronic device 100. If the overlay marks 102 are present in the scribe region, fewer restrictions are present on the material used for the optical contrast material 105 since the scribe region is not exposed to subsequent process acts that may affect the overlay marks 102. Alternatively, the overlay marks 102 may be formed in a die region of the electronic device 100 if the overlay marks 102 do not affect electrical properties of the electronic device 100. If the overlay marks 102 are present in the die region, the overlay marks 102 may not substantially affect integration.

Figures 4, 5, 6:
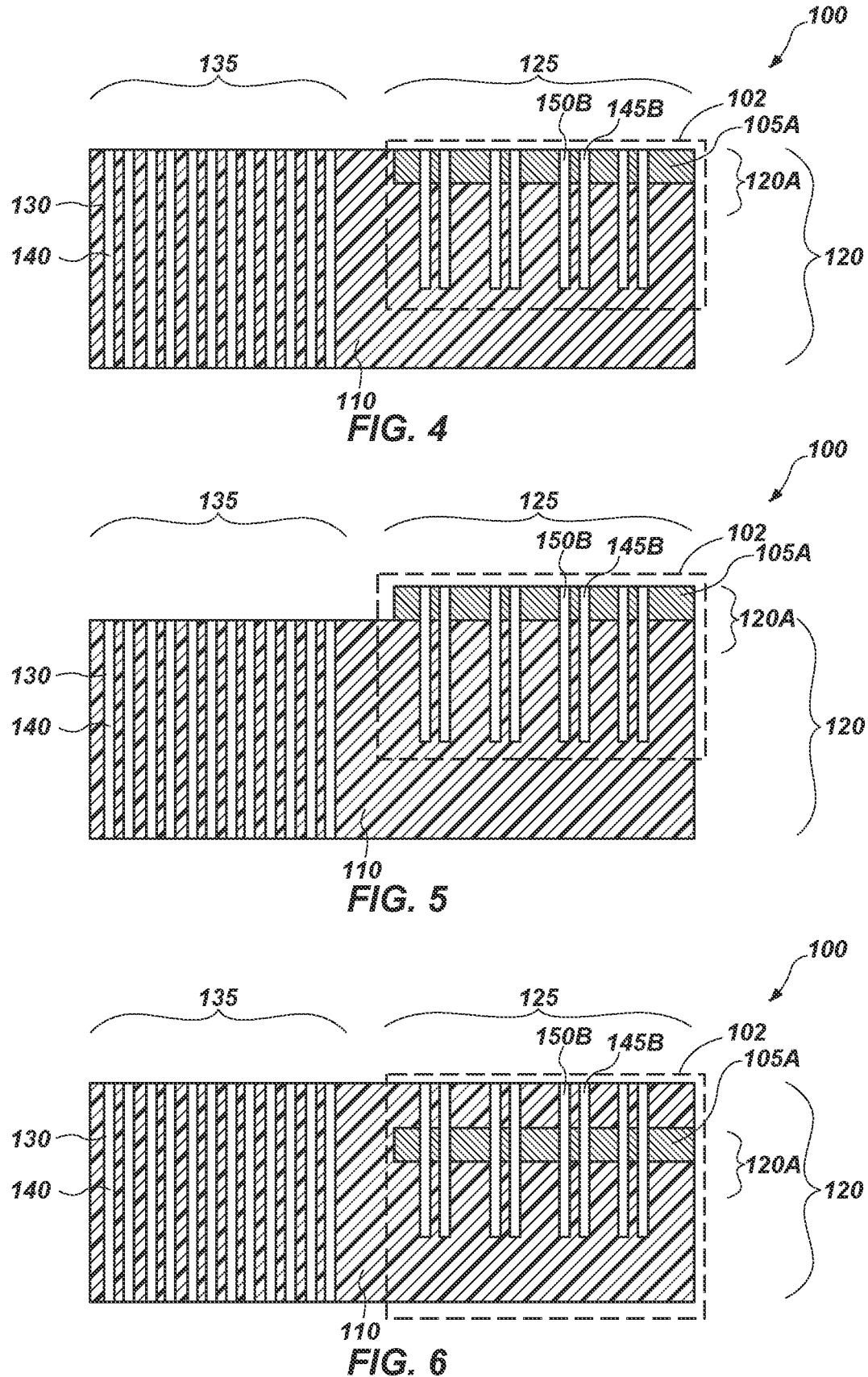
Figures 7A, 7B:
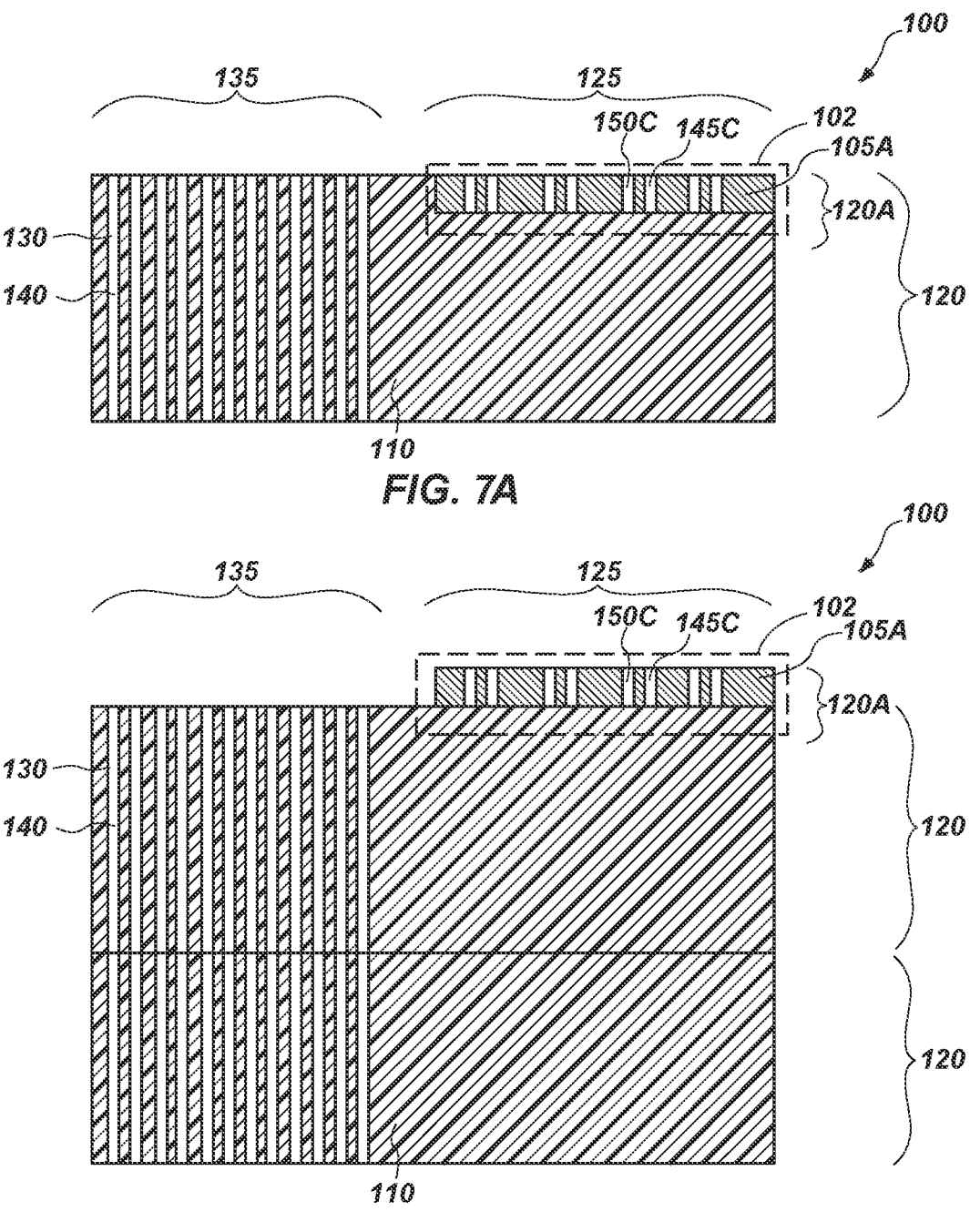
Figure 8:
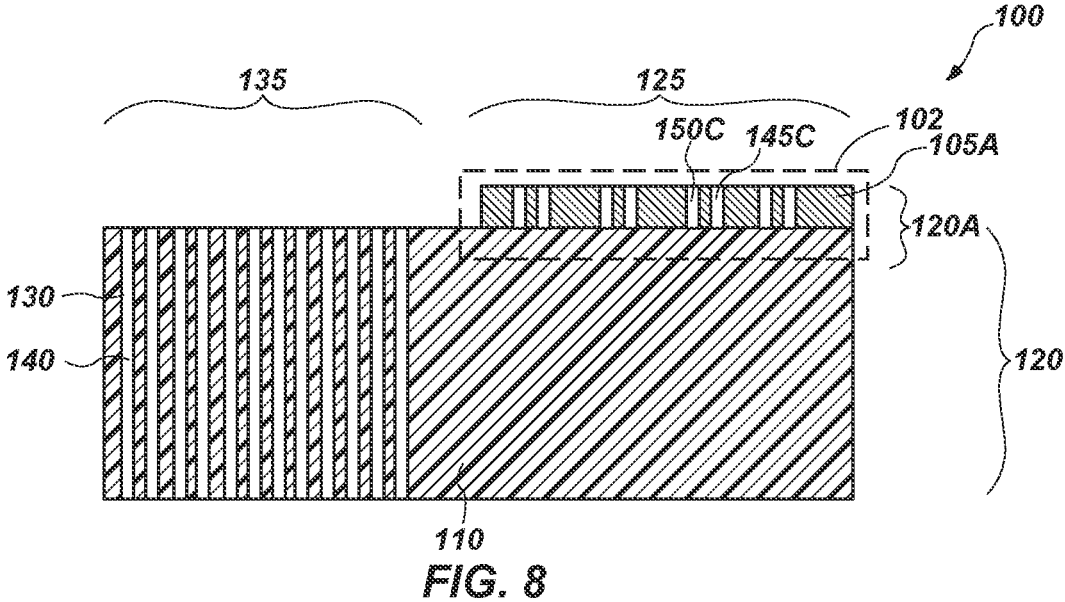
Figure 9:
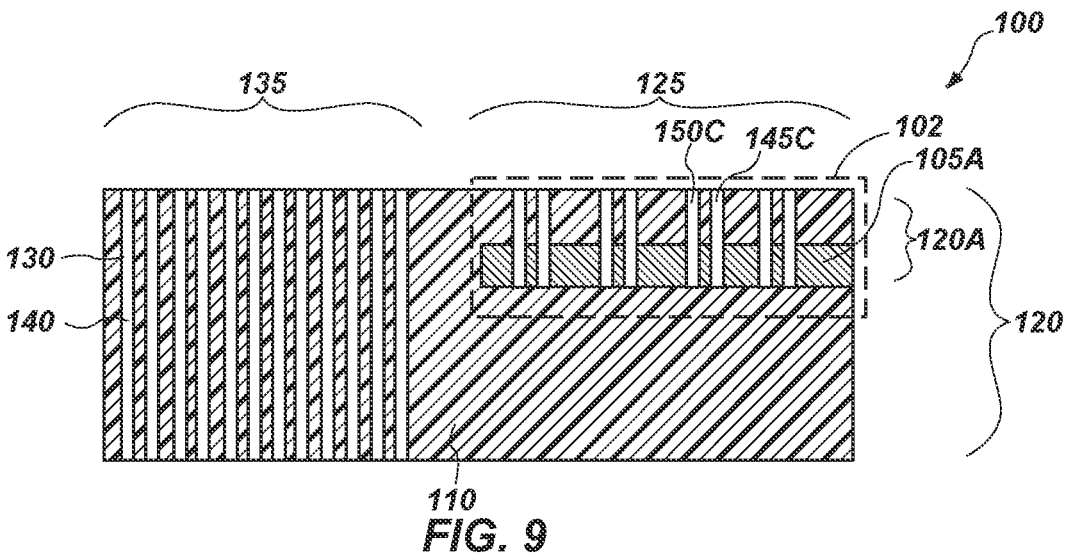
Figure 16:
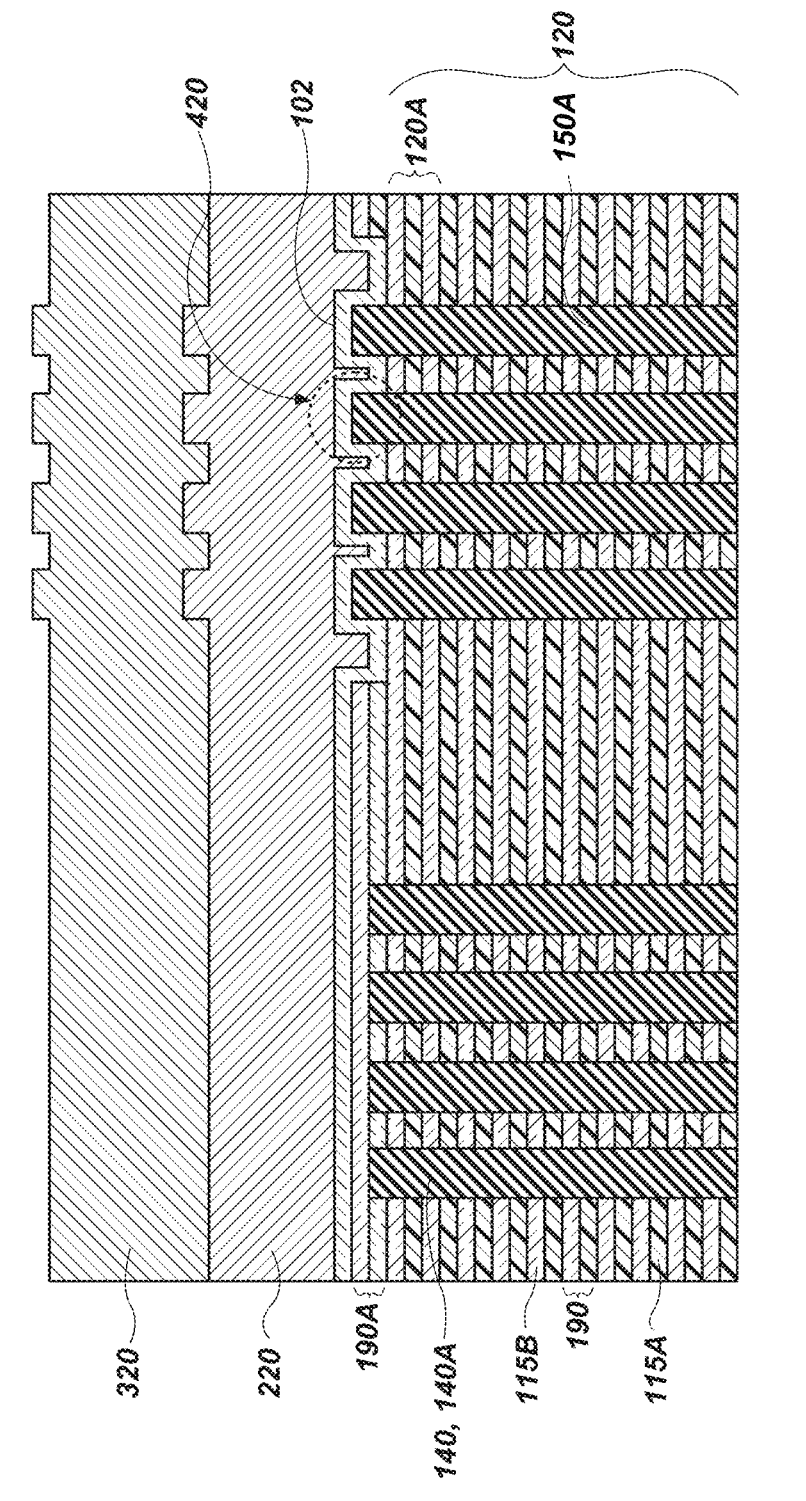
Figure 17:
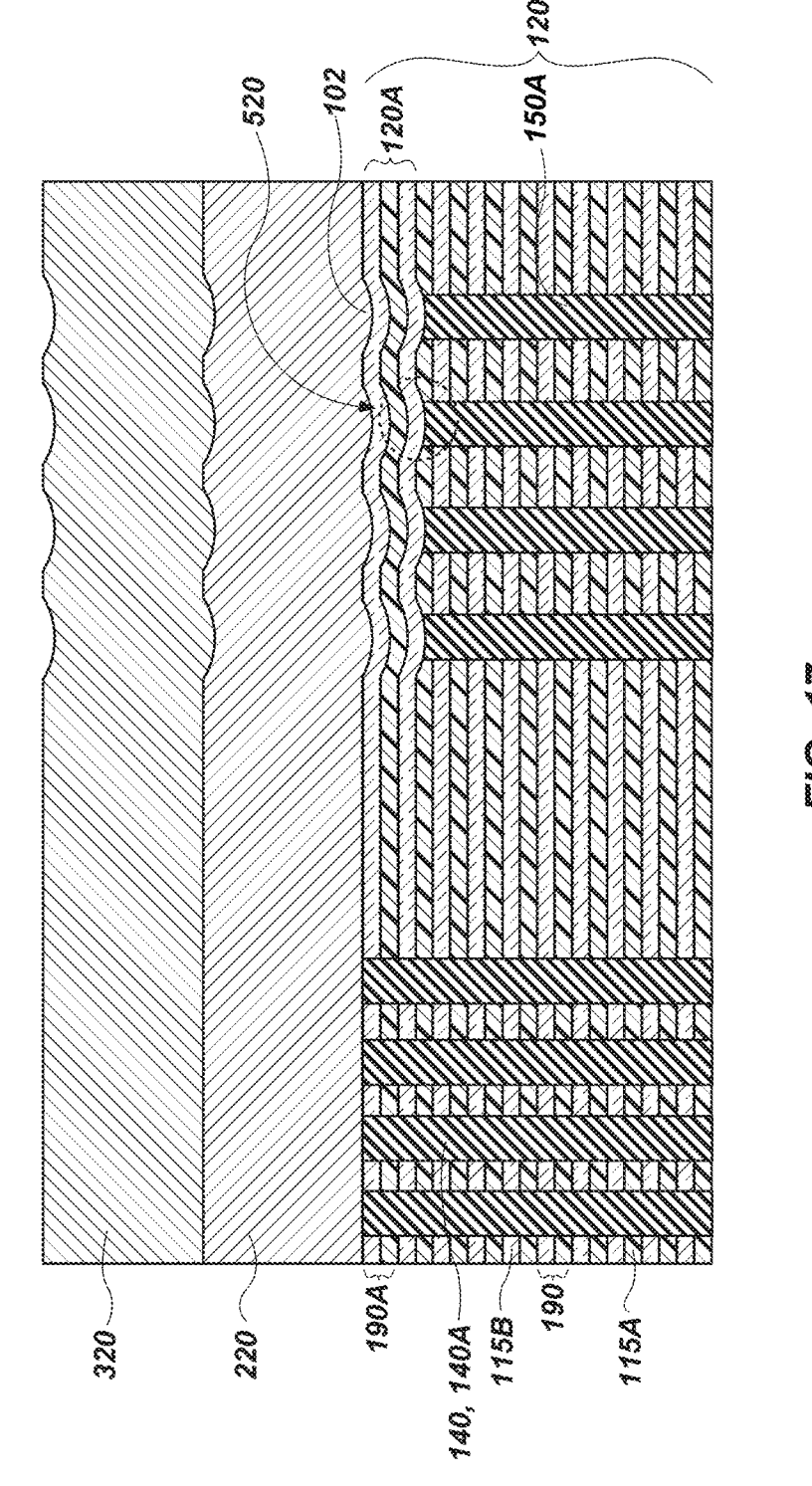

The optical contrast material 105 of the overlay marks 102 may be positioned in or on only the upper portion 120A of the tiers, such as within a few tiers from the uppermost tier, as shown in FIGS. 3, 6, and 9, on the uppermost tier, as shown in FIGS. 2, 5, and 8, or within the uppermost tier, as shown in FIGS. 1, 4, 7A, 7B, and 10-15. The overlay marks 102 may be lacking from other portions of the electronic device 100. In FIGS. 2, 5, and 8, the optical contrast material 105 of the overlay marks 102 may protrude above the uppermost tier. In FIGS. 1, 3, 4, 6, 7A, 7B, and 9, the optical contrast material 105 of the overlay marks 102 may be within the upper portion 120A of the tiers. The optical contrast material 105 in the overlay mark region 125 may be positioned laterally adjacent to the HAR features 140A in the array region 135 and laterally adjacent to the HAR features 150A, medium aspect ratio features 150B, or low aspect ratio features 150C in the overlay mark region 125, as shown in FIGS. 1-9, 14, and 15. The optical contrast material 105 may alternatively be positioned vertically adjacent to (e.g., over, directly over) the HAR features 150A in the overlay mark region 125, as shown in FIGS. 10-13. In FIGS. 10-13, the optical contrast material 105 of the overlay marks 102 may be configured as a plug-like structure while the optical contrast material 105 of the overlay marks 102 in FIGS. 1-9, 14, and 15 may be configured as a so-caller "layer" structure. In FIGS. 1-9, the layer of the optical contrast material 105 may only be present in the overlay mark region 125. The layer of the optical contrast material 105 may, alternatively, be present in the array region 135 and in the overlay mark region 125, as shown in FIGS. 14 and 15. While only two examples are illustrated in FIGS. 14 and 15, the optical contrast material 105 may extend over the array region 135 and the overlay mark region 125 in the embodiments of FIGS. 2, 3, and 5-9. In FIGS. 16 and 17, the optical contrast material 105 of the overlay marks 102 may be configured as raised topography or sunken topography.

As shown in FIGS. 1-3, the overlay marks 102 only in the upper portion may be configured as high aspect ratio features 150A including the opaque material 105A functioning as the low aspect ratio feature and the feature material 110. The opaque material 105A of the overlay marks 102 may provide good opacity to the radiation detected by the metrology system. The opaque material 105A may exhibit a refractive index mismatch, which provides the optical contrast. Signal detected by the metrology system may be contributed by the upper portion of the stack 120, with the signal blocked from the middle and bottom portions of the stack 120. The high aspect ratio features 140 may be present in the array region 135. In FIG. 14, the overlay marks 102 may be configured as high aspect ratio features 150A including the opaque material 105A functioning as the low aspect ratio feature and the feature material 110, except that the opaque material 105A extends over the array region 135 and the overlay mark region 125.

As shown in FIGS. 4-6, the overlay marks 102 only in the upper portion may be configured as medium aspect ratio features 150B including the opaque material 105A functioning as the low aspect ratio feature and the feature material 110. The opaque material 105A of the overlay marks 102 may provide good opacity to the radiation detected by the metrology system. The opaque material 105A may exhibit a refractive index mismatch, which provides the optical contrast, and good etch selectivity to the stack 120. Signal detected by the metrology system may be contributed by the upper portion of the stack 120, with the signal blocked from the middle and bottom portions of the stack 120. The high aspect ratio features 140 may be present in the array region 135. In FIG. 15, the overlay marks 102 may be configured as medium aspect ratio features 150B including the opaque material 105A functioning as the low aspect ratio feature and the feature material 110, except that the opaque material 105A extends over the array region 135 and the overlay mark region 125.

As shown in FIGS. 7A-9, the overlay marks 102 only in the upper portion may be configured as low aspect ratio features 150C including the opaque material 105A functioning as the low aspect ratio feature and the feature material 110. The opaque material 105A of the overlay marks 102 may provide good opacity to the radiation detected by the metrology system. The opaque material 105A may exhibit a refractive index mismatch, which provides the optical contrast, and good etch selectivity to the stack 120. Signal detected by the metrology system may be contributed by the low aspect ratio feature 150C. The high aspect ratio features 140 may be present in the array region 135.

Since the opaque material 105A in FIGS. 1-9 is laterally adjacent to the high aspect ratio features 150A, medium aspect ratio features 150B, or low aspect ratio features 150C, any optical signal produced from the middle and lower portions of the tiers is substantially blocked by the opaque material 105A. Therefore, the optical signal detected by the photolithography system may be substantially due to the optical signal generated from the upper portion 120A of the tiers, which enables subsequently-formed tiers to be aligned with the overlay marks 102 based on correct alignment and overlay information obtained from the upper portion 120A of the tiers.

The opaque material 105A of the overlay marks 102 may be formed from a material through which the tiers below the overlay marks 102 may be at most partially removed by process acts (e.g., conditions of etch acts) that form the HAR openings 130. The opaque material 105A of the overlay marks 102 may be formed from a so-called "soft etch" material that substantially prevents (e.g., substantially blocks) the transmission and reflection of radiation from the other portions of the stack 120, such as from the middle portion and/or the lower portion. Therefore, the optical signal contributed by the other portions of the stack 120 does not substantially contribute to the optical signal detected by the photolithography system. The opaque material 105A may be amorphous carbon, polysilicon, doped polysilicon, or a hard mask material. The opaque material 105A may, alternatively, include one or more of the materials mentioned below for the reflective material 105B. When formed to a greater thickness, the materials mentioned below for the reflective material 105B may be opaque. The overlay marks 102 of FIGS. 1-9, 14, and 15 may be formed of the opaque material 105A. In some embodiments, the opaque material 105A is amorphous carbon.

The reflective material 105B of the overlay marks 102 may be formed from a so-called "hard etch" material that completely or substantially completely prevents removal of materials underlying the reflective material 105B when exposed to removal process conditions, such as etch process conditions. The reflective material 105B substantially prevents or substantially reduces the extent of removing (e.g., etching) the materials of the tiers below the overlay marks 102 (e.g., the tiers in the overlay mark region 125 and below the overlay marks 102) when the tiers are exposed to etch conditions used to form the HAR openings 130 in the array region 135. The tiers in the array region 135 and the tiers in the overlay mark region 125 may be exposed to the same etch conditions, following which the HAR openings 130 are formed in the array region 135. The reflective material 105B may also be substantially resistant to the etch conditions used in subsequent process acts, such as substantially resistant to wet etch conditions used to remove nitride materials in a replacement gate process. The hard etch material may be highly reflective (e.g., highly refractive) so that the optical signal does not penetrate through the overlay marks 102. The reflective material 105B may be one or more of a metal (e.g., a transition metal), a metal nitride, a metal silicide, silicon, silicon-germanium, or other highly reflective material. By way of example only, the reflective material 105B may be one or more of tungsten, tungsten nitride, tungsten silicide, titanium, titanium nitride, nickel silicide, molybdenum silicide, polysilicon, carbon-doped polysilicon, carbon, or graphene. In some embodiments, the reflective material 105B is tungsten. The overlay marks 102 of FIGS. 10-13 may include the reflective material 105B.

In FIGS. 10-13, the reflective material 105B substantially prevents or substantially reduces the optical signal from the metrology system from penetrating the materials in the overlay mark region 125 and below the overlay marks 102. The reflectivity of the overlay marks 102 increases the contribution of the optical signal reflected by the upper portion 120A of the tiers in the overlay mark region 125 and detected by the photolithography system, enabling subsequently-formed tiers to be aligned with the overlay marks 102 based on correct alignment and overlay information obtained from the upper portion 120A of the tiers.

The overlay marks 102 of FIGS. 16 and 17 may be configured as positive topography 420 or negative topography 520 in the materials of the stack 120. Additional materials of subsequently-formed decks 220, 320 may be formed over the HAR features 140 in the overlay mark region 125 having the positive topography 420 or negative topography 520, translating the positive topography 420 or negative topography 520 to the subsequently-formed decks 220, 320. The additional materials of the decks 220, 320 formed over the HAR features 140 may exhibit the positive topography (FIG. 16) or the negative topography (FIG. 17). The additional materials of the decks 220, 320 may be opaque to the wavelength(s) of radiation used by the metrology system. The material of the overlay marks 102 functions in combination with the feature material 110 of the high aspect ratio features 140 as the overlay marks 102. The positive topography 420 or negative topography 520 may be present in the upper portion 120A of the tiers of the base stack 120. The positive topography 420 or negative topography 520 in the upper portion 120A of the base stack 120 may be used to align subsequently formed decks. The positive topography or negative topography may be used to reduce or eliminate issues with conventional overlay-topography transfer.

Figure 21:
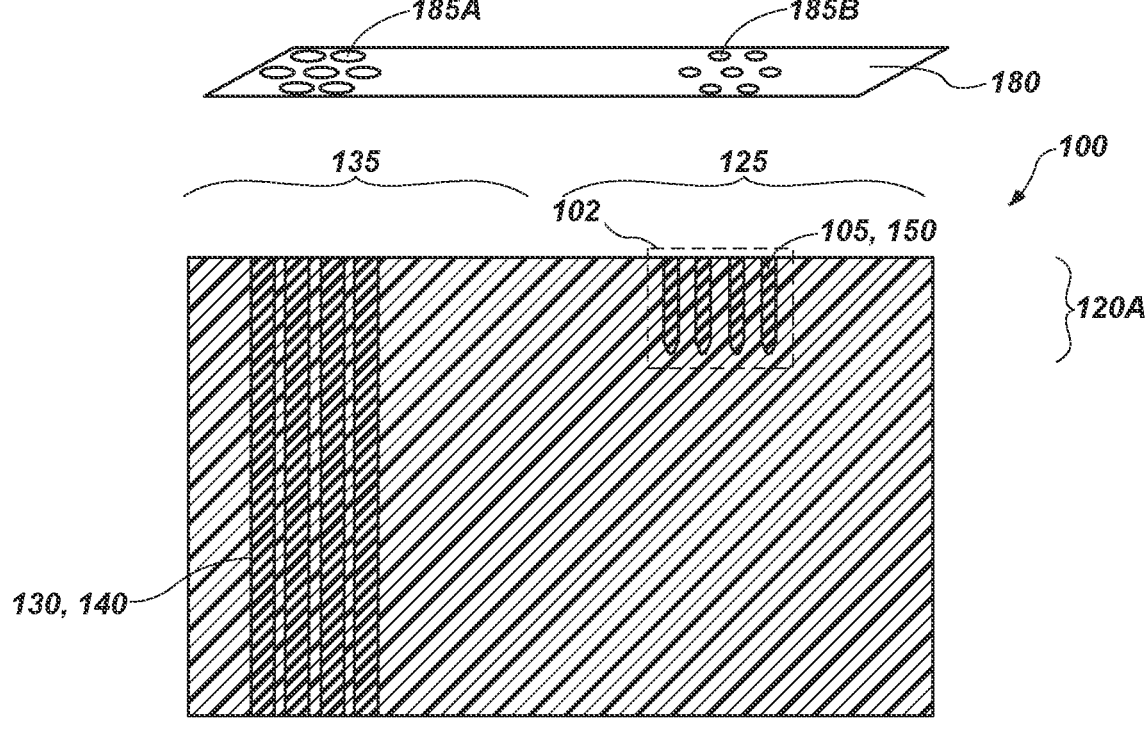
FIG. 21 is a cross-sectional view of an electronic device including overlay marks according to embodiments of the disclosure in an upper portion of an overlay mark region and HAR features in an array region.

As shown in FIG. 21, the overlay marks 102 may include low aspect ratio features 150C in low aspect ratio openings 145C in the upper portion 120A of the tiers. The low aspect ratio features 150C may include the feature material 110 or the sacrificial material in the low aspect ratio openings 145C. The low aspect ratio openings 145C may be positioned in the overlay mark region 125 and exhibit a critical dimension (CD) substantially smaller than the CD of the HAR openings 130 in the array region 135. The low aspect ratio openings 145C may only be present in the upper portion of the tiers while the HAR openings 130 extend through the upper portion 120A as well as the middle and lower portions of the tiers in the array region 135. The HAR openings 130 extend through the tiers while the low aspect ratio openings 145C extend only partially into the tiers. The feature material 110 or the sacrificial material may be formed in the HAR openings 130 at substantially the same time as the feature material 110 or the sacrificial material is formed in the low aspect ratio openings 145C. Since the CD of the low aspect ratio openings 145C and low aspect ratio features 150C is substantially smaller than the CD of the HAR openings 130, radiation from the metrology system does not substantially penetrate beyond the upper portion 120A in the overlay mark region 125.

The overlay marks 102 according to embodiments of the disclosure may be used in any 3D electronic device in which the HAR features 140 are to be formed in the array region 135 of multideck electronic devices, where one or more additional decks are present over the initial deck including the overlay marks 102. The electronic devices 100 including the overlay marks 102 according to embodiments of the disclosure may be formed by a so-called "replacement gate" process or a so-called "floating gate" process. By way of example only, the overlay marks 102 according to embodiments of the disclosure may be used to form 3D NAND electronic devices, such as a 3D NAND Flash memory device, a 3D floating gate NAND Flash memory device, or a 3D replacement gate NAND Flash memory device. The overlay marks 102 according to embodiments of the disclosure may also be used to form 3D DRAM electronic devices or 3D logic.

The overlay marks 102 of FIGS. 1-9, 14, and 15 may be formed in the base stack 120 (e.g., the first deck) by conventional semiconductor fabrication techniques. During subsequent processing to form the electronic devices 100, the high aspect ratio openings 130 may be formed in the array region 135 and the high aspect ratio openings 145A, medium aspect ratio openings 145B, or low aspect ratio openings 145C may be formed in the overlay mark region 125. Additional stacks (e.g., additional decks) may be formed over the base stack 120.

To form the overlay marks 102 of FIGS. 1, 3, 4, 6, 7A, 7B, 9, 14, and 15 in the upper portion 120A of the tiers 190 (see FIGS. 16-20), the stack 120 including the alternating materials is formed to include a desired number of tiers. The desired number of tiers depend on the overall aspect ratio of the HAR features 140 ultimately to be formed in the array region 135 of the electronic device 100. The materials of the stack 120 are formed by conventional techniques, which are not described in detail herein. A photoresist (not shown) is formed over the uppermost tier and patterned to expose a portion of the uppermost tier in the overlay mark region 125 while the photoresist remains over the uppermost tier in the array region 135. The photoresist over the overlay mark region 125 is removed to expose the underlying tiers in the overlay mark region 125. The exposed portion of the uppermost tier, or of the uppermost tier and one or more of the underlying materials of the underlying tiers, in the overlay mark region 125 may be removed by conventional techniques through the patterned photoresist, forming an opening (not shown) in the overlay mark region 125. The opening may extend at least through the uppermost tier and may optionally extend into one or more of the underlying materials of the underlying tiers. The photoresist may be removed, and the optical contrast material 105 may be formed in the opening and any excess removed from over the uppermost tier by a mechanical abrasion act, such as by a chemical-mechanical planarization (CMP) act, to form the overlay marks 102 of FIGS. 1-9, 14, and 15. Alternatively, the overlay marks 102 of FIGS. 1-9, 14, and 15 may be formed by forming the optical contrast material 105 over the uppermost tier, forming the photoresist over the optical contrast material 105, patterning the photoresist and the optical contrast material 105 to form the overlay marks 102 in the overlay mark region 125, and forming additional materials of a second deck (not shown) over the overlay marks 102 and the uppermost tier.

After forming the overlay marks 102, the HAR openings 130 in the array region 135 may be formed by conventional techniques. If the overlay marks 102 include the reflective material 105B, which functions as an etch stop, the openings 145 in the overlay mark region 125 do not extend below the optical contrast material 105. If the overlay marks 102 are formed of the opaque material 105A, the openings 145 may extend past the optical contrast material 105 and into the upper portion 120A but do not extend completely through the tiers. The HAR openings 130 and the high, medium, and low aspect ratio openings 145A-145C are formed by subjecting the materials of the stack 120 to conventional etch chemistries, which may be appropriately selected depending on the materials of the stack 120 used. When the tiers in the array region 135 and in the overlay mark region 125 are exposed to the etch chemistries, the HAR openings 130 are formed in the array region 135 and substantially extend through a thickness of the stack 120. The openings 145 in the overlay mark region 125 are formed and extend through a thickness of the optical contrast material 105 and, optionally, into the upper portion 120A. The openings 145 in the overlay mark region 125 and the HAR openings 130 in the array region 135 may be formed at substantially the same time when exposed to substantially the same etch conditions.

In FIGS. 7A-9, the openings 145 do not extend below the optical contrast material 105 and do not extend into the tiers. In FIGS. 1-6, 14, and 15, the openings 145 extend below the optical contrast material 105 and at least into the upper portion 120A. The openings 145 may extend at least partially into the stack 120 or substantially completely through the stack 120. One or more additional stacks 120 (see FIG. 7B), including the alternating materials of the stack 120, may then be formed over the base stack 120 using the overlay marks 102 to align the subsequently-formed stacks. Additional HAR openings 130 may be formed in the additional stacks by conventional techniques.

After forming the desired number of stacks over the base stack, the feature material 110 may be formed in the HAR openings 130 to form the HAR features 140 as shown in FIGS. 1-9, 14, and 15. While only the base stacks 120 are shown as including the feature material 110, the additional stacks also include the feature material 110. Alternatively, a sacrificial material may be formed in the HAR openings 130 of the base stack 120 and the additional stacks and removed and replaced with the feature material 110 during subsequent processing. The feature material 110 may also be formed in the openings 145 (e.g., high aspect ratio openings 145A, medium aspect ratio openings 145B, or low aspect ratio openings 145C) or the sacrificial material may be formed in the high, medium, or low aspect ratio openings 145A-145C. The feature material 110 may be appropriately selected depending on the HAR features 140 to be formed in the array region 135. For instance, if the HAR features 140 are pillars, a pillar material may be formed in the HAR openings 130. The pillar material may include, but is not limited to, polysilicon. Therefore, the HAR features 140 are formed in the array region 135 of the base stack 120 and the additional stacks, and the overlay mark region 125 of the initial tier includes the overlay marks 102.

To form the overlay marks 102 of FIGS. 2, 5, and 8, the materials of the stack 120 may be formed as described above to include the desired number of tiers. As shown in FIGS. 2, 5, and 8, the overlay marks 102 may be present on a top surface of the uppermost tier of the tiers. The optical contrast material 105 may be formed over the uppermost tier and the photoresist (not shown) formed over the optical contrast material 105. The photoresist may be patterned to expose the underlying optical contrast material 105 in the array region 135 while the photoresist remains over the optical contrast material 105 in the overlay mark region 125. The optical contrast material 105 in the array region 135 is removed, followed by removing the photoresist over the optical contrast material 105 in the overlay mark region 125 to form the overlay marks 102 in the overlay mark region 125 and on the uppermost tier.

After forming the overlay marks 102, the HAR openings 130 in the array region 135 and the high, medium, or low aspect ratio openings 145A-145C in the overlay mark region 125 may be formed as described above. The high, medium, or low aspect ratio openings 145A-145C in the overlay mark region 125 and the HAR openings 130 in the array region 135 may be formed at substantially the same time when exposed to substantially the same etch conditions. The high, medium, or low aspect ratio openings 145A-145C may only be present in the optical contrast material or in the upper portion of the tiers while the HAR openings 130 extend through the upper portion 120A. The materials of the tiers may be exposed to conventional etch conditions to form the HAR openings 130 substantially extending through the thickness of the stack 120 and to form the high, medium, or low aspect ratio openings 145A-145C extending into or through the optical contrast material 105. The HAR openings 130 substantially extend through the thickness of the stack 120 and the high, medium, or low aspect ratio openings 145A-145C extend through the optical contrast material 105 and into the upper portion 120A. The medium and low aspect ratio openings 145B, 145C do not extend through the tiers. One or more additional stacks (not shown) including the alternating materials may then be formed over the base stack 120 using the overlay marks 102 to align the subsequently-formed stacks as described above. Additional HAR openings 130 may be formed in the additional stacks by conventional techniques. After forming the desired number of stacks over the base stack 120, the HAR openings 130 and the high, medium, or low aspect ratio openings 145A-145C may be filled with the feature material 110 or the sacrificial material, as described above, to form the HAR features 140 in the array region 135.

Figures 10, 11, 12:
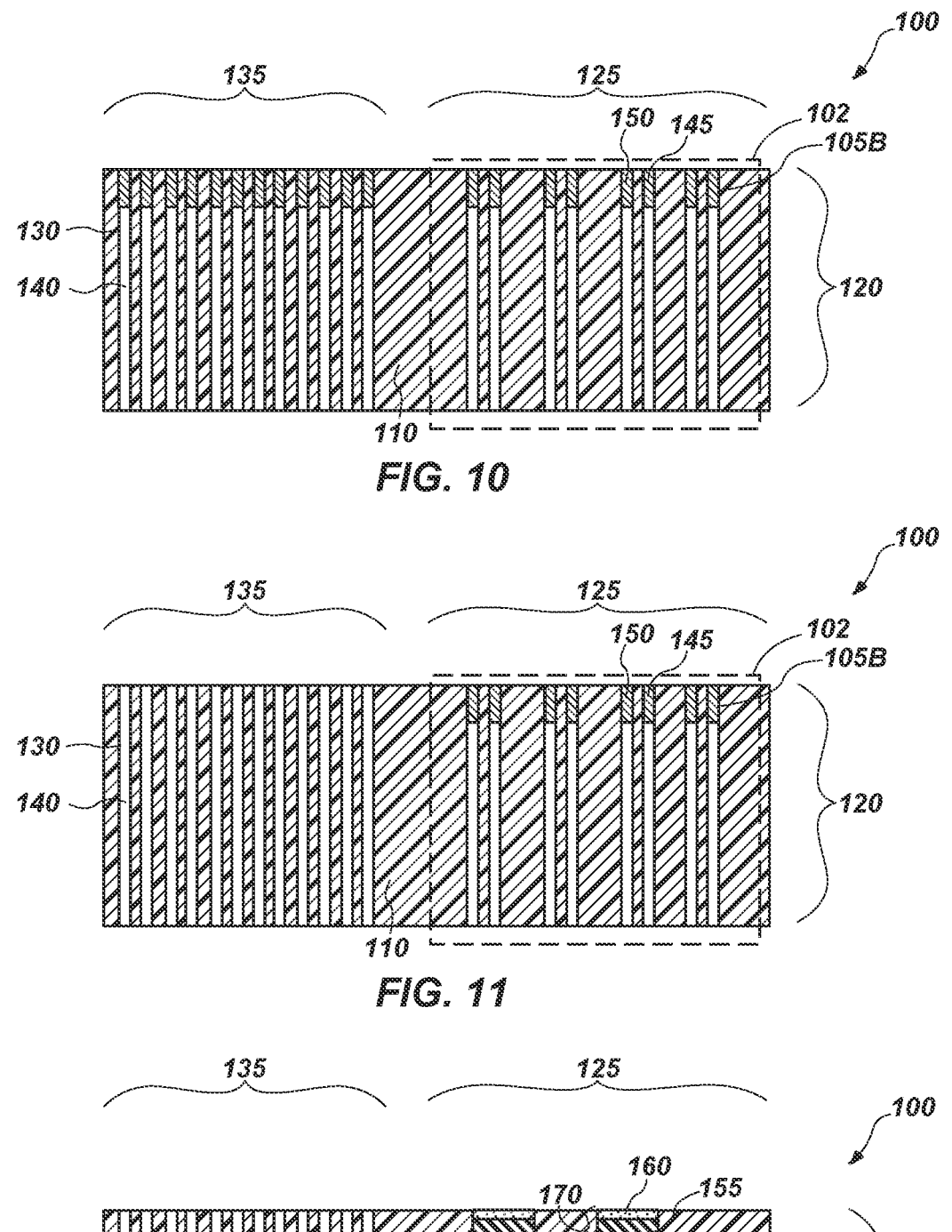

To form the overlay marks 102 in the embodiments of FIGS. 10 and 11, the stack 120 including the alternating materials is formed, as described above, to include the desired number of tiers. The HAR features 140, 150A, such as pillars, are formed in the array region 135 and in the overlay mark region 125 by conventional techniques. The HAR features 140, 150A may, for example, be polysilicon pillars. The photoresist (not shown) is formed over the uppermost tier and the photoresist is patterned to expose the HAR features 150A in the overlay mark region 125. A portion of the exposed HAR features 150A in the overlay mark region 125 is removed, recessing the HAR features 150A in the overlay mark region 125. The photoresist may be removed and the optical contrast material 105 (i.e., the reflective material 105B) may be formed in the recesses in the overlay mark region 125. Excess reflective material formed over the uppermost tier may be removed, forming the overlay marks 102 of FIG. 11. The overlay marks 102 of FIG. 10 are formed similarly, except that the photoresist is patterned to expose the HAR features 140, 150A in the array region 135 and in the overlay mark region 125. After removing the photoresist, the optical contrast material 105 (i.e., the reflective material 105B) may be formed in the recesses in the array region 135 and in the overlay mark region 125. The overlay marks 102 of FIGS. 10 and 11 are formed of the reflective material 105B and are in direct contact with (e.g., directly over) the HAR features 140 in the overlay mark region 125.

Figure 18:
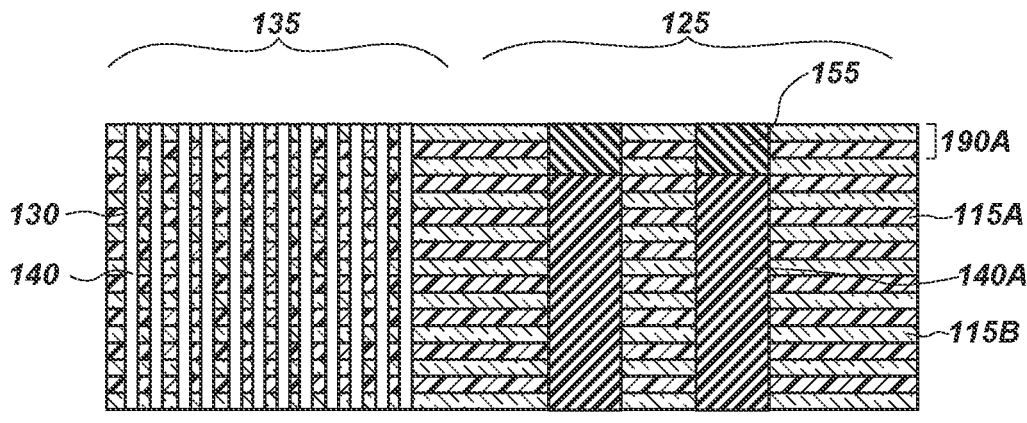
FIGS. 18-20 are cross-sectional views showing various stages of forming the overlay marks of the electronic devices of FIGS. 6, 7A, and 7B in accordance with embodiments of the disclosure.

To form the overlay marks 102, corresponding to the metal silicide/polysilicon structure 170 in the embodiments of FIGS. 12 and 13, the stack 120 including the alternating materials is formed as described above to include the desired number of tiers. The HAR features 140, 150A, such as the pillars, are formed in the array region 135 and in the overlay mark region 125 of the stack 120, and a polysilicon material 155, such as a polysilicon plug, is formed over the HAR features 140, as shown in FIG. 18. The HAR features 140 and polysilicon material 155 are formed in the array region 135 and in the overlay mark region 125 by conventional techniques. After cleaning a surface of the polysilicon material 155 and the tiers 190, a portion of the polysilicon material 155 is metallized, forming a metal silicide 160 over the polysilicon material 155, as shown in FIGS. 12 and 13.

Figure 19:
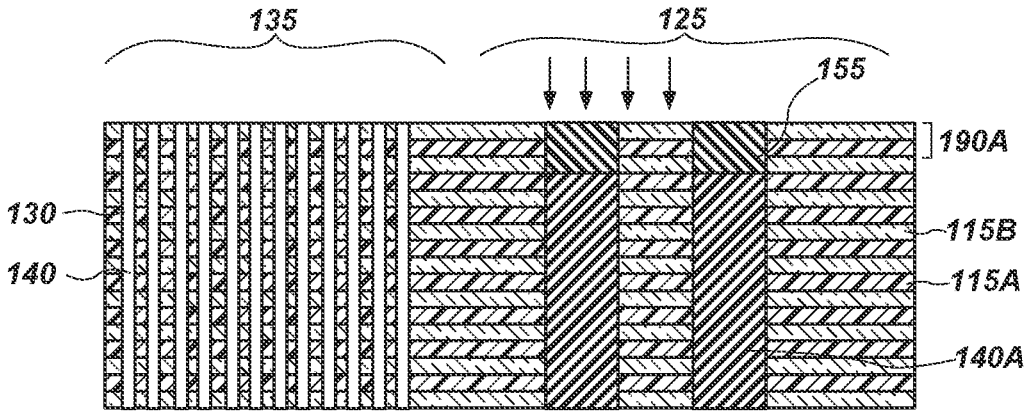

To form the metal silicide 160, the polysilicon of the polysilicon material 155 may be exposed to a metal species, indicated by arrows in FIG. 19, which reacts selectively with the polysilicon to form the metal silicide 160. The metal species and silicon atoms of the polysilicon react at a temperature where the metal species is a gaseous material. The metal species does not substantially react with the materials of the stack 120. The polysilicon material 155 may be exposed to the gaseous material including the metal species and the gaseous metal species may react with the silicon atoms of the polysilicon to selectively form the metal silicide 160 over the polysilicon material 155. The metal species may be a metal (e.g., a transition metal) including, but not limited to, one or more of titanium, cobalt, nickel, copper, zinc, zirconium, molybdenum, ruthenium, silver, hafnium, tantalum, tungsten, platinum, or gold, an alloy of the metal, or a compound of the metal. In some embodiments, the metal species includes titanium, which reacts with the polysilicon to form titanium silicide. In other embodiments, the metal species includes tungsten, which reacts with the polysilicon to form tungsten silicide. The metallization reaction may be conducted at a reaction temperature and for a sufficient amount of time for the metallization reaction to occur. The reaction temperature, reaction time, and other reaction conditions may be selected as appropriate to conduct the metallization reaction. To form the overlay marks 102 of FIGS. 12 and 13, the amount of polysilicon converted to the metal silicide 160 may be tailored by adjusting the reaction temperature and reaction time of the metallization reaction.

The polysilicon material 155 may be metallized for a sufficient amount of time to convert a desired portion of the polysilicon material 155 to the metal silicide 160. A shorter amount of time may convert a smaller amount of polysilicon to the metal silicide 160, as shown in FIG. 12, while a longer amount of time may convert a larger amount of polysilicon to the metal silicide 160, as shown in FIG. 13. By converting a portion of the polysilicon material 155 to the metal silicide 160 and forming a metal silicide/polysilicon structure 170, a surface of the polysilicon material 155 becomes reflective and the metal silicide/polysilicon structure 170 may function as the overlay marks 102. The metal silicide/polysilicon structure 170 provides an improved optical response compared to that of the polysilicon material 155 alone, which has a poor optical response. A cleaning act (e.g., a wet cleaning act) may be conducted after forming the metal silicide 160 to selectively remove unreacted metal species from the uppermost tier 190A while the metal silicide 160 remains over the polysilicon material 155. Since the unreacted metal species may be removed by the cleaning act, no CMP act is conducted after metallizing the polysilicon material 155.

Figure 20:
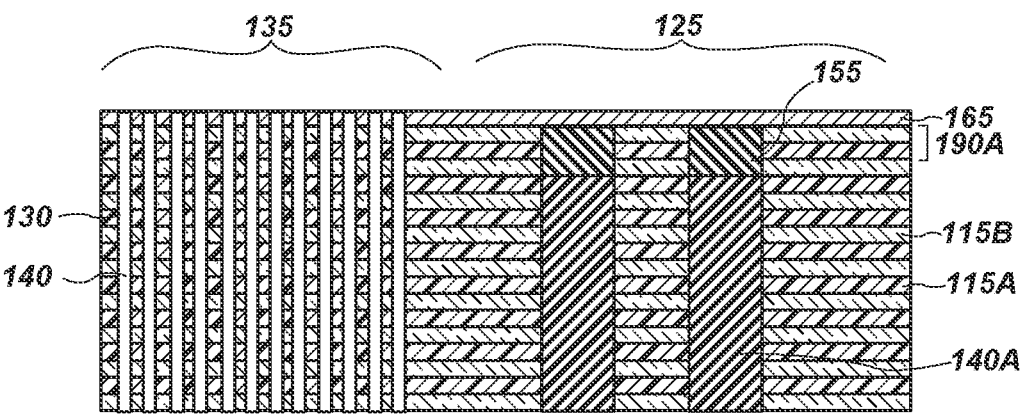

Alternatively, the metal silicide 160 may be formed by forming a metal material 165 (e.g., a metal sheet) over the uppermost tier 190A and polysilicon material 155 as shown in FIG. 20. The metal material 165 may be exposed to heat, so that the metal species diffuses into the polysilicon and reacts with the silicon atoms to form the metal silicide 160 over the polysilicon material 155. Unreacted metal material 165 over the uppermost tier 190A may be selectively removed while the metal silicide 160 remains over the polysilicon material 155. To form the overlay marks 102, corresponding to the metal silicide/polysilicon structure 170 of FIGS. 12 and 13, the amount of polysilicon converted to the metal silicide 160 may be tailored by adjusting the reaction temperature and reaction time of the metallization reaction.

By tailoring the amount of polysilicon converted to the metal silicide 160, optical contrast properties and etch selectivity properties (e.g., etch performance) of the metal silicide/polysilicon structure 170 may be tailored. If a relatively larger amount of the metal silicide 160 is present relative to the amount of polysilicon, the metal silicide/polysilicon structure 170 may exhibit optical contrast properties similar to those of a metal silicide, providing improved optical contrast. In such a situation, the metal silicide/polysilicon structure 170 may function as a so-called "hard" etch stop material. However, the etch selectivity properties of the metal silicide/polysilicon structure 170 may be reduced (i.e., the etch selectivity may be more similar to the etch selectivity exhibited by the metal silicide) relative to the etch selectivity properties of the polysilicon material 155. If a relatively larger amount of the polysilicon material 155 is present relative to the amount of metal silicide 160, the metal silicide/polysilicon structure 170 may exhibit sufficient optical contrast properties due to the metallized polysilicon surface for alignment and registration. In such a situation, the resulting metal silicide/polysilicon structure 170 may function as a so-called "soft" etch stop material without substantially affecting the etch selectivity properties. The etch selectivity properties of the metal silicide/polysilicon structure 170 may, therefore, be substantially the same as the etch selectivity properties of polysilicon.

By way of example only, if the metal silicide/polysilicon structure 170 included a thickness of about 50 nm of the polysilicon material 155 and a thickness of about 10 nm of the metal silicide 160, the etch selectivity properties of the metal silicide/polysilicon structure 170 would be substantially the same as the etch selectivity properties of polysilicon and the optical contrast properties would be substantially the same as the optical contrast properties of the metal silicide. Alternatively, if the metal silicide/polysilicon structure 170 included a thickness of about 10 nm of the polysilicon material 155 and a thickness of about 50 nm of the metal silicide 160, the etch selectivity properties of the metal silicide/polysilicon structure 170 would be substantially the same as the etch selectivity properties of the metal silicide and the optical contrast properties would be substantially the same as the optical contrast properties of polysilicon.

The metallization of the polysilicon material 155 may also cause an increase in volume of the metal silicide/polysilicon structure 170 compared to the volume of the polysilicon material 155 before the metallization is conducted. The volume increase may cause a change in topography surrounding the metal silicide/polysilicon structure 170, which topography change may provide additional optical contrast for alignment and registration.

The overlay marks 102, corresponding to the metal silicide/polysilicon structure 170 of FIGS. 12 and 13, may also be produced by removing a portion of the polysilicon material 155 at the process stage shown in FIG. 18 to recess the polysilicon material 155. The gaseous metal species may be exposed to a top surface of the polysilicon material 155 to form the metal silicide on the polysilicon material 155 as discussed above. Alternatively, the metal material 165 may be selectively formed in the recesses and reacted with the silicon atoms to form the metal silicide 160 over the polysilicon material 155. Excess metal material 165 over the uppermost tier 190A may be removed, such as by a CMP act. To form the overlay marks 102 of FIGS. 12 and 13, the amount of metal silicide 160 in the recesses may be tailored by removing a desired amount of the polysilicon material 155 before introducing the gaseous metal species or forming the metal material 165 in the recesses.

To form the overlay marks 102 of FIG. 16, the stack 120 including the materials of the stack 120 is formed as described above to include the desired number of tiers. The HAR features 140, 150A, such as the pillars 140A, are formed in the array region 135 and in the overlay mark region 125 by conventional techniques. The HAR features 140, 150 may, for example, be polysilicon pillars 140A, 150A. A portion of the materials of the stack 120 laterally adjacent to the HAR features 150A may be removed, selectively recessing the materials relative to the HAR features 140, 150A. Therefore, the HAR features 150A have a positive (e.g., raised) topography 420. One or more of the materials of the stack 120 (e.g., the opaque material 105A, the reflective material 105B) may then be formed over the positive topography 420 to form the overlay marks 102, which include the positive (e.g., raised) topography 420 and the HAR features 150A, in the overlay mark region 125. Alternatively, the reflective material 105B may be formed over the positive topography 420 and contribute to the optical contrast provided by the positive topography 420. One or more stacks 220, 320 including the alternating materials of the stack 120 may be formed by conventional techniques over the base stack 120, using the overlay marks 102 of the base stack 120 to align the subsequently-formed stacks. The positive topography 420 of the HAR features 150A may be translated to subsequently-formed stacks 220, 320.

To form the overlay marks 102 of FIG. 17, the stack 120 including the alternating materials is formed as described above to include the desired number of tiers. The HAR features 140, 150A, such as the polysilicon pillars 140A, 150A are formed in the array region 135 and in the overlay mark region 125 by conventional techniques. The HAR features 140, 150A may, for example, be polysilicon pillars 140A, 150A. A portion of the HAR features 150A may be removed in the overlay mark region 125, recessing the feature material 110 or sacrificial material relative to the materials of the stack. Therefore, the HAR features 150A have a negative (e.g., sunken) topography 520. One or more of the materials of the stack 120 may be formed over the negative topography 520 to form the overlay marks 102. Alternatively, the reflective material 105B may be formed over the negative topography 520 and contribute to the optical contrast provided by the negative topography 520. One or more stacks including the alternating materials of the stack 120 may be formed by conventional techniques over the base stack 120, using the overlay marks 102 of the base stack 120 to align the subsequently-formed stacks. The negative topography 520 of the HAR features 150A may be translated to the subsequently-formed stacks, including to the topmost stacks.

To form the overlay marks 102 of FIG. 21, a reticle 180 including differently sized reticle openings 185A, 185B may be formed by conventional techniques. Openings corresponding to the reticle openings 185A are formed in an array region 135 of the reticle 180 and the reticle openings 185B are formed in an overlay mark region 125 of the reticle 180. The reticle openings 185A may be substantially larger than the reticle openings 185B, such as exhibiting a CD of at least about double the CD of the reticle openings 185B. In some embodiments, the reticle openings 185A exhibit a CD of about 100 nm and the reticle openings 185B exhibit a CD of about 50 nm. The reticle 180 is used to form the HAR openings 130 in the array region of the stack 120, which extend through the tiers 190, and to form the low aspect ratio openings 145C in the overlay mark region 125 at substantially the same time. The HAR openings 130 and the low aspect ratio openings 145C are formed by conventional photolithography techniques. Since the low aspect ratio openings 145C have a substantially lower CD, the low aspect ratio openings 145C only extend into the upper portion 120A of the stack 120 and do not extend through the tiers 190. When the feature material or sacrificial material is formed in the HAR openings 130 to form the HAR features 140, the feature material or sacrificial material may also form in the low aspect ratio openings 145C, forming the low aspect ratio features 150C that reflect radiation.

After forming the overlay marks 102, the HAR openings 130 in the array region 135 may be formed by conventional techniques. If the overlay marks 102 include the reflective material 105B, the reflective material 105B prevents the low aspect ratio openings 145C formed in the overlay mark region 125 from extending below the overlay marks 102. If the overlay marks 102 are formed of the opaque material 105A, the low aspect ratio openings 145C may extend past the overlay marks 102 and into the upper portion 120A but do not extend through the tiers 190. The HAR openings 130 and the low aspect ratio openings 145C are formed by subjecting the materials of the stack 120 to conventional etch chemistries, which may be appropriately selected depending on the materials 115A, 115B used. When the tiers in the array region 135 and in the overlay mark region 125 are exposed to the appropriate etch chemistries, the HAR openings 130 are formed in the array region 135 and substantially extend through a thickness of the stack 120. The low aspect ratio openings 145C are formed in the overlay mark region 125 and extend through a thickness of the overlay marks 102 and, optionally, into the upper portion 120A. One or more additional stacks (not shown) including the alternating materials 115A, 115B may then be formed over the base stack 120 using the overlay marks 102 to align the subsequently-formed stacks. Additional HAR openings 130 may be formed in the additional stacks by conventional techniques.

Accordingly, an electronic device is disclosed. The electronic device comprises at least one high aspect ratio feature in a base stack of materials. Overlay marks are in or on only an upper portion of the base stack of materials. An additional stack of materials is over the base stack of materials and comprises the at least one high aspect ratio feature.

Accordingly, an electronic device is disclosed. The electronic device comprises at least one high aspect ratio feature in an array region of a base stack of materials. Overlay marks are in or on an upper portion of the base stack of materials. One or more additional stacks of materials is adjacent the base stack of materials and comprises the at least one high aspect ratio feature.

Accordingly, a memory device is disclosed. The memory device comprises at least one high aspect ratio feature in a multideck structure comprising stacks of materials. Overlay marks are in or on only an upper portion of an initial stack of the stacks of materials.

Accordingly, a method of forming high aspect ratio features in an electronic device is disclosed. The method comprises forming a base stack of materials comprising at least one high aspect ratio opening and overlay marks in only an upper portion of the base stack of materials. One or more additional stacks of materials are formed adjacent the base stack of materials. The one or more additional stacks of materials comprise at least one high aspect ratio opening that is substantially aligned with the at least one high aspect ratio opening in the base stack of materials. A feature material or a sacrificial material is formed in the at least one high aspect ratio openings in the base stack of materials and in the one or more additional stacks of material to form high aspect ratio features.

Additional processing acts may subsequently be conducted to form a memory device that includes the electronic device 100 and additional components. The subsequent process acts may be conducted by conventional techniques, which are not described in detail herein.

Figure 22:
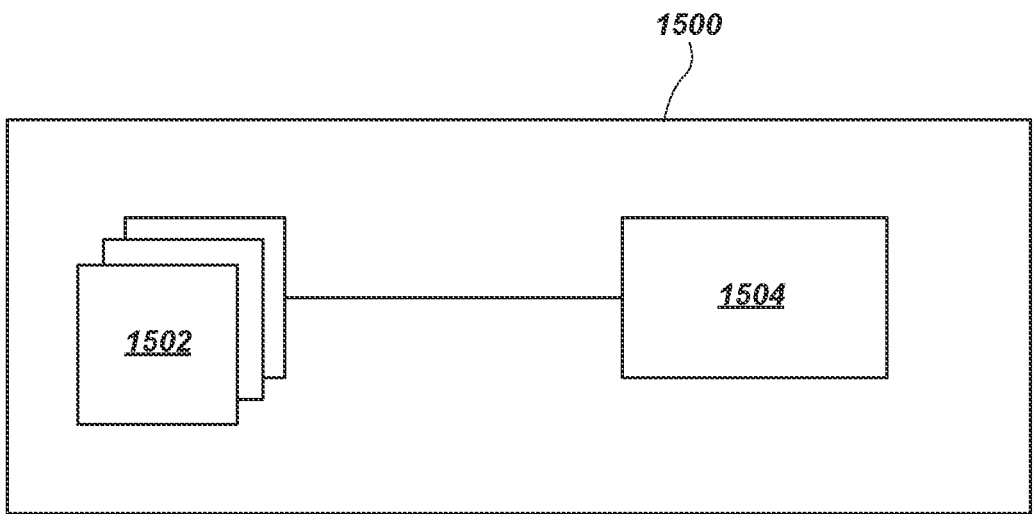
FIG. 22 is a schematic block diagram illustrating a memory device including one or more of the electronic devices in accordance with embodiments of the disclosure.

The electronic devices 100 according to embodiments of the disclosure may be used in a memory device 1500 that includes a memory array 1502 of memory cells. The memory device 1500 (e.g., a DRAM device) is shown schematically in the functional block diagram of FIG. 22. The memory device 1500 includes the memory array 1502 of memory cells including one or more electronic devices 100 and a control logic component 1504. The control logic component 1504 may be configured to operatively interact with the memory array 1502 so as to read, write, or re-fresh any or all memory cells within the memory array 1502.

Figure 23:
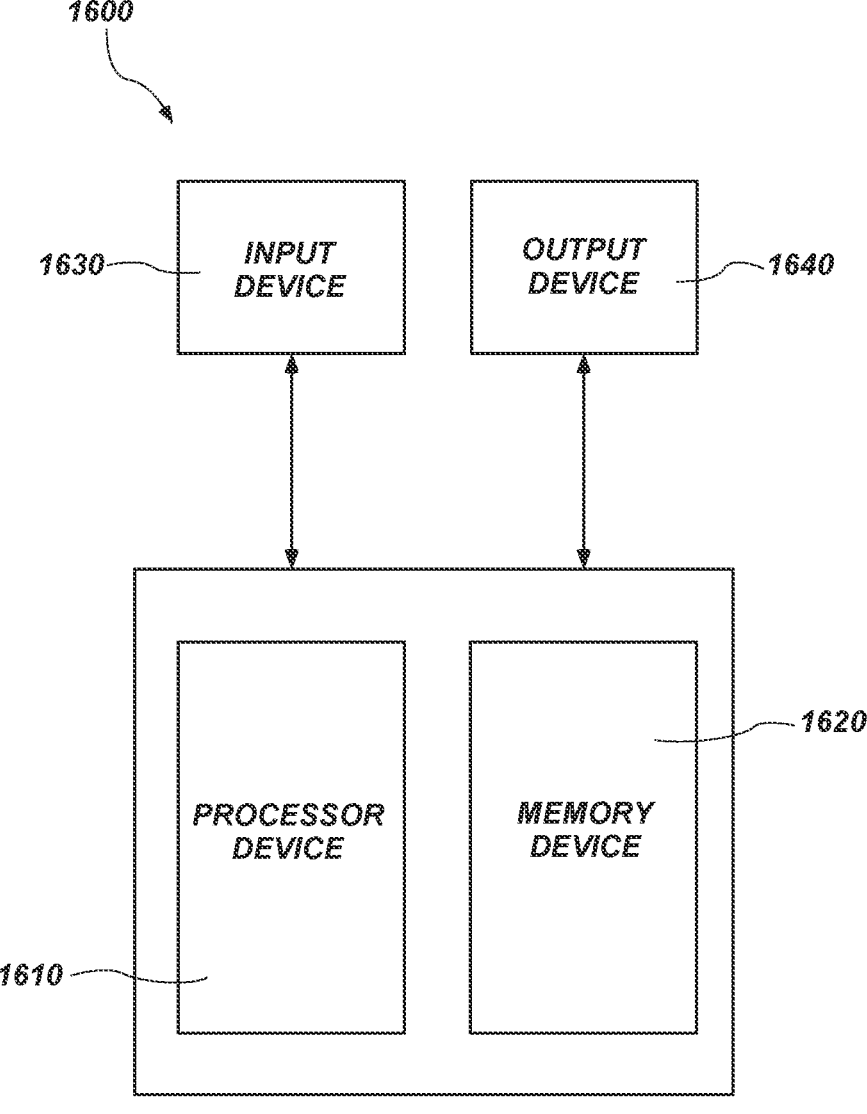
FIG. 23 is a schematic block diagram illustrating an electronic system including one or more of the electronic devices in accordance with embodiments of the disclosure.

An electronic system 1600 is also disclosed, as shown in FIG. 23, and includes the electronic devices 100 according to embodiments of the disclosure. FIG. 23 is a simplified block diagram of the electronic system 1600 implemented according to one or more embodiments described herein. The electronic system 1600 may comprise, for example, a computer or computer hardware component, a server or other networking hardware component, a cellular telephone, a digital camera, a personal digital assistant (PDA), portable media (e.g., music) player, a Wi-Fi or cellular-enabled tablet such as, for example, an iPad® or SURFACE® tablet, an electronic book, a navigation device, etc. The electronic system 1600 includes at least one memory device 1620, which includes memory cells including one or more electronic devices 100 as previously described. The electronic system 1600 may further include at least one processor device 1610 (often referred to as a "processor"). The processor device 1610 may, optionally, include one or more electronic devices 100 as previously described. The electronic system 1600 may further include one or more input devices 1630 for inputting information into the electronic system 1600 by a user, such as, for example, a mouse or other pointing device, a keyboard, a touchpad, a button, or a control panel. The electronic system 1600 may further include one or more output devices 1640 for outputting information (e.g., visual or audio output) to a user such as, for example, a monitor, a display, a printer, an audio output jack, a speaker, etc. In some embodiments, the input device 1630 and the output device 1640 may comprise a single touchscreen device that can be used both to input information to the electronic system 1600 and to output visual information to a user. The one or more input devices 1630 and output devices 1640 may communicate electrically with at least one of the memory device 1620 and the processor device 1610.

While certain illustrative embodiments have been described in connection with the figures, those of ordinary skill in the art will recognize and appreciate that embodiments encompassed by the disclosure are not limited to those embodiments explicitly shown and described herein. Rather, many additions, deletions, and modifications to the embodiments described herein may be made without departing from the scope of embodiments encompassed by the disclosure, such as those hereinafter claimed, including legal equivalents. In addition, features from one disclosed embodiment may be combined with features of another disclosed embodiment while still being encompassed within the scope of the disclosure.

What is claimed is:

1. An electronic device comprising:
a multideck structure comprising a base stack of materials and one or more stacks of materials on the base stack of materials;
at least one high aspect ratio feature in an array region in the base stack of materials and in the one or more stacks of materials;
overlay marks comprising an optical contrast material in or on only an upper portion of the base stack of materials in an overlay mark region of the electronic device, the overlay mark region laterally adjacent to the array region; and
at least one additional high aspect ratio feature in the base stack of materials and extending through the overlay marks.

2. The electronic device of claim 1,
wherein the base stack of materials comprises tiers of alternating first and second materials, each tier comprising a collective unit of the first material and the second material, the second material directly underlying the first material, and
wherein the optical contrast material is in or on an uppermost tier of the base stack of materials.

3. The electronic device of claim 1, wherein the optical contrast material comprises an opaque material.

4. The electronic device of claim 1, wherein the overlay marks are laterally adjacent to the at least one additional high aspect ratio feature in the base stack of materials.

5. The electronic device of claim 1, wherein the base stack of materials and the one or more stacks of materials are optically transparent.

6. The electronic device of claim 1, wherein the overlay marks are configured to substantially prevent transmission and reflection of optical radiation from one or more of a middle portion and a lower portion of the base stack of materials.

7. The electronic device of claim 1, wherein the optical contrast material comprises amorphous carbon.

8. An electronic device comprising:
   a multideck structure comprising a base stack of materials and one or more stacks of materials on the base stack of materials;
   at least one high aspect ratio feature in an array region in the base stack of materials and in the one or more stack of materials;
   overlay marks comprising an optical contrast material in or on only an upper portion of the base stack of materials in an overlay mark region of the electronic device, the overlay mark region laterally adjacent to the array region; and
   at least one medium aspect ratio feature in the base stack of materials and extending through the overlay marks.

9. The electronic device of claim 8,
   wherein the base stack of materials comprises tiers of alternating conductive and dielectric materials, each tier comprising a collective unit of the conductive material and the dielectric material, and
   wherein the optical contrast material is in or on an uppermost tier of the base stack of materials.

10. The electronic device of claim 8, wherein the optical contrast material comprises an opaque material comprising amorphous carbon, polysilicon, doped polysilicon, or a hard mask material.

11. The electronic device of claim 8, wherein the base stack of materials and the one or more stacks of materials are configured to be selectively etchable relative to the optical contrast material of the overlay marks.

12. An electronic device comprising:
   a multideck structure comprising a base stack of materials and one or more stacks of materials on the base stack of materials;
   at least one high aspect ratio feature in an array region in the base stack of materials and in the one or more stack of materials;
   overlay marks comprising an optical contrast material in or on only an upper portion of the base stack of materials in an overlay mark region of the electronic device, the overlay mark region laterally adjacent to the array region; and
   at least one medium aspect ratio feature in the base stack of materials and extending through the overlay marks, wherein the at least one medium aspect ratio feature is optically transparent.

13. The electronic device of claim 8, wherein no medium aspect ratio feature of the at least one medium aspect ratio feature is below the optical contrast material.

14. The electronic device of claim 8, wherein:
   the at least one high aspect ratio feature comprises a feature material, and
   wherein the at least one medium aspect ratio feature comprises the same feature material as the at least one high aspect ratio feature.

* * * * *